(12) United States Patent
Lee

(10) Patent No.: US 11,764,228 B2
(45) Date of Patent: Sep. 19, 2023

(54) DISPLAY DEVICE

(71) Applicant: Samsung Display Co., Ltd., Yongin-Si (KR)

(72) Inventor: Yong Hee Lee, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 332 days.

(21) Appl. No.: 16/808,330

(22) Filed: Mar. 3, 2020

(65) Prior Publication Data
US 2021/0036021 A1 Feb. 4, 2021

(30) Foreign Application Priority Data

Jul. 31, 2019 (KR) .......................... 10-2019-0092971

(51) Int. Cl.
*H01L 27/12* (2006.01)
*G09G 3/36* (2006.01)

(52) U.S. Cl.
CPC ......... *H01L 27/124* (2013.01); *G09G 3/3677* (2013.01); *G09G 3/3688* (2013.01); *G09G 2300/0426* (2013.01)

(58) Field of Classification Search
CPC ............. H01L 27/124; H01L 29/41733; G02F 1/136286
See application file for complete search history.

(56) References Cited

U.S. PATENT DOCUMENTS

2001/0052889 A1* 12/2001 Fukunishi ......... G02F 1/136213
345/87
2004/0075780 A1* 4/2004 Lee ................... G02F 1/136286
349/43
(Continued)

FOREIGN PATENT DOCUMENTS

| KR | 10-2001-0111265 A | 12/2001 |
| KR | 10-2006-0086488 A | 8/2006 |
| KR | 10-1675372 B1 | 11/2016 |

OTHER PUBLICATIONS

"Portion." In The American Heritage(R) Dictionary of the English Language, edited by Editors of the American Heritage Dictionaries. 6th ed. Houghton Mifflin, 2016. https://search.credoreference.com/content/entry/hmdictenglang/portion/0?institutionId=743 (Year: 2016).*

*Primary Examiner* — Peter M Albrecht
(74) *Attorney, Agent, or Firm* — Innovation Counsel LLP

(57) ABSTRACT

A display device is provided. A display device includes a substrate; a gate electrode disposed on the substrate; a semiconductor pattern disposed to overlap the gate electrode; a source electrode disposed on the semiconductor pattern; a drain electrode disposed on the semiconductor pattern and facing the source electrode; and a pixel electrode connected to the drain electrode, wherein the drain electrode comprises a bar-shaped portion disposed on the semiconductor pattern and extending in one direction, a compensation portion connected to one distal end portion of the bar-shaped portion, a connecting portion connected to the other distal end portion of the bar-shaped portion, and an pad portion connected to the connecting portion and overlapping the pixel electrode, wherein the bar-shaped portion has a first width and at least portions of the compensation portion and the connecting portion have a second width that is greater than the first width.

19 Claims, 17 Drawing Sheets

(56) References Cited

U.S. PATENT DOCUMENTS

| | | | |
|---|---|---|---|
| 2007/0018159 A1* | 1/2007 | Baek | H01L 27/124 257/E27.111 |
| 2007/0132902 A1* | 6/2007 | Yao | G02F 1/136286 349/43 |
| 2008/0078992 A1* | 4/2008 | Yang | H01L 27/283 257/40 |

* cited by examiner

Fig. 7
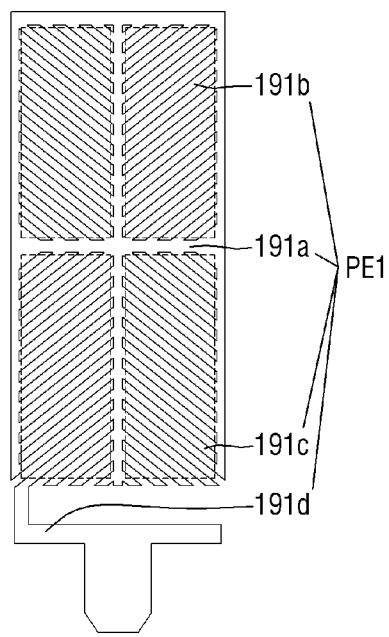
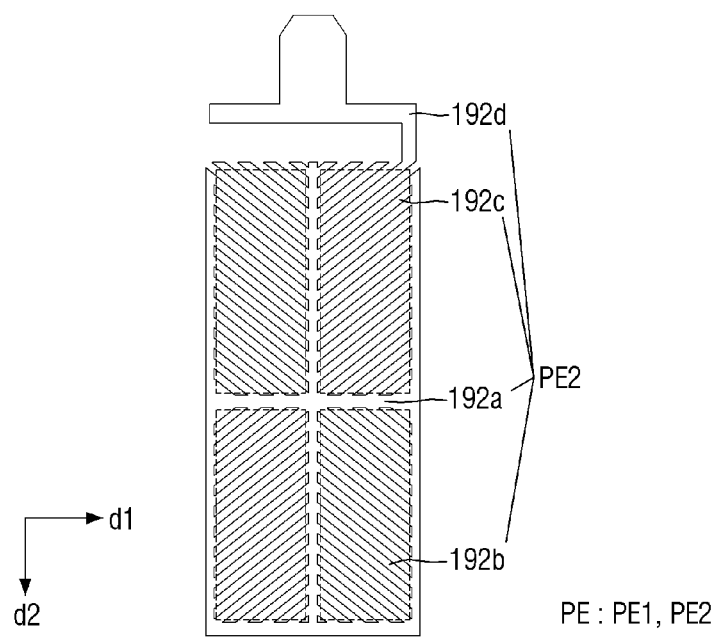

DISPLAY DEVICE

This application claims priority to Korean Patent Application No. 10-2019-0092971 filed on Jul. 31, 2019 in the Korean Intellectual Property Office, and all the benefits accruing therefrom under 35 U.S.C. § 119, the disclosure of which is incorporated herein by reference in its entirety.

BACKGROUND

1. Field of the Disclosure

The present disclosure relates to a display device.

2. Description of the Related Art

A liquid crystal display (LCD) device includes two substrates on which electric-field generating electrodes (e.g., a pixel electrode, a common electrode, and the like) are formed and a liquid crystal (LC) layer is disposed therebetween. An electric field is generated in the LC layer by applying a voltage to the electric-field generating electrodes. The orientation of LC molecules in the LC layer is determined due to the electric field, the polarization of incident light is controlled, and thus an image is displayed.

The LCD device may include a thin-film transistor (TFT) configured to drive pixels. The TFT includes a gate electrode, a source electrode and a drain electrode. The gate electrode may partially overlap the source electrode and the drain electrode. A parasitic capacitance generated in an overlapping portion between the gate electrode and the source electrode, and the gate electrode and the drain electrode may cause a kickback voltage and affect a data signal.

Meanwhile, a process variation may be caused during a manufacturing process of the LCD device. When overlap areas between the gate electrode and the source electrode, and the gate electrode and the drain electrode vary depending on locations of pixels due to the process variation, a parasitic capacitance may also vary depending on locations of the pixels. As a result, a kickback voltage may vary according to a pixel, thereby making display quality non-uniform.

SUMMARY

Aspects of the present disclosure provide a display device having uniform display quality.

It should be noted that objects of the present disclosure are not limited to the above-described objects, and other objects of the present disclosure will be apparent to those skilled in the art from the following descriptions.

An embodiment of a display device includes a substrate; a gate electrode disposed on the substrate; a semiconductor pattern disposed to overlap the gate electrode; a source electrode disposed on the semiconductor pattern; a drain electrode disposed on the semiconductor pattern and facing the source electrode; and a pixel electrode connected to the drain electrode, wherein the drain electrode comprises a bar-shaped portion disposed on the semiconductor pattern and extending in one direction, a compensation portion connected to one distal end portion of the bar-shaped portion, a connecting portion connected to the other distal end portion of the bar-shaped portion, and a pad portion connected to the connecting portion and overlapping the pixel electrode, and wherein the bar-shaped portion has a first width and at least portions of the compensation portion and the connecting portion have a second width that is greater than the first width.

An embodiment of a display device includes a first pixel row comprising a plurality of first pixels arranged in a first direction; a second pixel row disposed adjacent to the first pixel row in a second direction intersecting the first direction, the second pixel row comprising a plurality of second pixels arranged in the first direction; a scan line disposed between the first pixel row and the second pixel row, the scan line configured to provide a scan signal to the plurality of first pixels and the plurality of second pixels; a first data line disposed on one sides of a pixel column and configured to provide a first data signal to a first pixel disposed in the first pixel column; and a second data line disposed on the other side of the pixel column and configured to provide a second data signal to a second pixel disposed in the first pixel column, wherein each of the plurality of first pixels comprises a gate electrode connected to the scan line, a first semiconductor pattern disposed to overlap the gate electrode, a first source electrode disposed on the first semiconductor pattern and connected to the first data line, a first drain electrode disposed on the first semiconductor pattern and configured to face the first source electrode, and a first pixel electrode connected to the first drain electrode, wherein the first drain electrode comprises a first bar-shaped portion disposed on the first semiconductor pattern and extending in the second direction, a first compensation portion connected to one distal end portion of the first bar-shaped portion, a first connecting portion connected to the other distal end portion of the first bar-shaped portion, and a first pad portion connected to the first connecting portion and overlapping the first pixel electrode, wherein the first bar-shaped portion has a first width and at least portions of the first compensation portion and the first connecting portion have a second width that is greater than the first width.

An embodiment of a display device includes a plurality of scan lines extending in a first direction, a plurality of data lines extending in a second direction which crosses the scan line, and a plurality of pixels arranged in a matrix configuration and connected to the plurality of scan lines and the plurality of data lines, wherein each of the plurality of pixels including: a thin film transistor including a semiconductor pattern, a gate electrode, a source electrode, a drain electrode which faces the source electrode and spaced apart a predetermined distance from the source electrode and a pixel electrode connected to the drain electrode, wherein the drain electrode including: a bar-shaped portion disposed on the semiconductor pattern and extending in the second direction, a compensation portion connected to one distal end portion of the bar-shaped portion, a connecting portion connected to the other distal end portion of the bar-shaped portion, and a pad portion connected to the connecting portion, and wherein the bar-shaped portion has a first width and the compensation portion and the connecting portion have a second width that is greater than the first width.

According to the exemplary embodiments of the present disclosure, a drain electrode of a switching element of a display device can adopt a gate capacitance compensation portion. Thus, even if a process variation occurs, each pixel can ensure a uniform gate capacitance. Accordingly, uniform display quality can be provided.

Effects according to the present disclosure are not limited by the above-described examples, and more various effects are included in the present disclosure.

BRIEF DESCRIPTION OF THE DRAWINGS

The above and other aspects and features of the present disclosure will become more apparent by describing exemplary embodiments thereof in detail with reference to the attached drawings, in which:

FIG. 7 is a layout view for illustrating a pixel electrode layer of FIG. 4;

DETAILED DESCRIPTION OF THE EMBODIMENTS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Hereinafter, exemplary embodiments of the present disclosure will be described with reference to the accompanying drawings.

Figure 1:
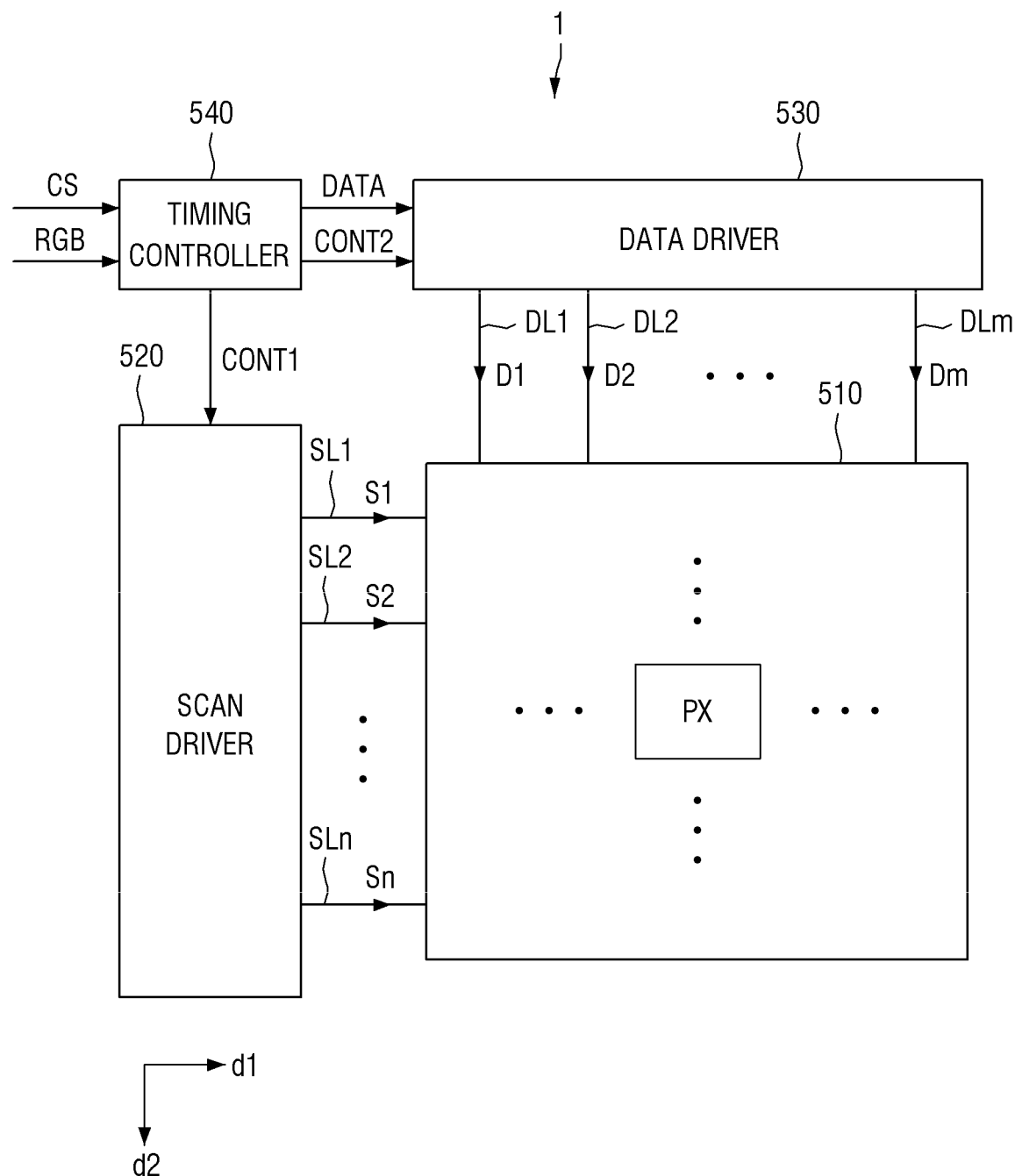
FIG. 1 is a schematic block diagram for illustrating a display device according to an exemplary embodiment of the present disclosure.

FIG. 1 is a schematic block diagram for illustrating a display device 1 according to an exemplary embodiment of the present disclosure.

Referring to FIG. 1, the display device 1 may include a display unit 510, a scan driver 520, a data driver 530, and a timing controller 540.

The display unit 510 may be defined as an area configured to display an image. The display unit 510 may include a plurality of pixels PX. The plurality of pixels PX may be arranged in a matrix shape in a first direction d1 and a second direction d2. A direction in which a row of a matrix of the pixels PX extends may be the first direction d1, and a direction in which a column of the matrix extends may be the second direction d2. The pixels PX may include a plurality of pixel rows (refer to 'PXR' in FIG. 3) to which signals are applied from adjacent signal lines in different directions. The above will be described in detail below.

Each of the pixels PX may receive a scan signal from any one of a plurality of scan lines SL1 to SLn (n is a natural number greater than or equal to 2). Further, each of the pixels PX may receive a data signal from any one of a plurality of data lines DL1 to DLm (m is a natural number greater than or equal to 2).

The scan driver 520 may generate scan signals S1 to Sn based on a first control signal CONT1 provided by the timing controller 540. The scan driver 520 may provide the generated scan signals S1 to Sn through the respective scan lines SL1 to SLn to the pixels PX of the display unit 510. The scan driver 520 may include a circuit element including a thin-film transistor (TFT) directly formed on a substrate or be implemented as an integrated circuit (IC) which is an external device.

The data driver 530 may receive a second control signal CONT2 and image data DATA from the timing controller 540. The data driver 530 may generate a plurality of data signals D1 to Dm based on the second control signal CONT2 and the image data DATA. The data driver 530 may provide the generated data signals D1 to Dm through the respective data lines DL1 to DLm to the pixels PX of the display unit 510. The data driver 530 may include a driver IC which is an external device. The driver IC may include a shift register, a latch, a digital-to-analog converter (DAC), and the like.

The timing controller 540 may receive an image signal RGB and a control signal CS from an external device, for example, a graphic controller. The timing controller 540 may process the image signal RGB and the control signal CS to be suitable for operating conditions of the display unit 510 and generate the image data DATA, the first control signal CONT1, and the second control signal CONT2. The image signal RGB may include a plurality of grayscale data to be provided to the display portion 510. In an embodiment, the control signal CS may include a horizontal synchronous signal, a vertical synchronous signal, a main clock signal, and the like. The main clock signal may be a reference signal used for the timing controller 540 to generate various signals in synchronization with each of the scan driver 520 and the data driver 530.

Figure 2:
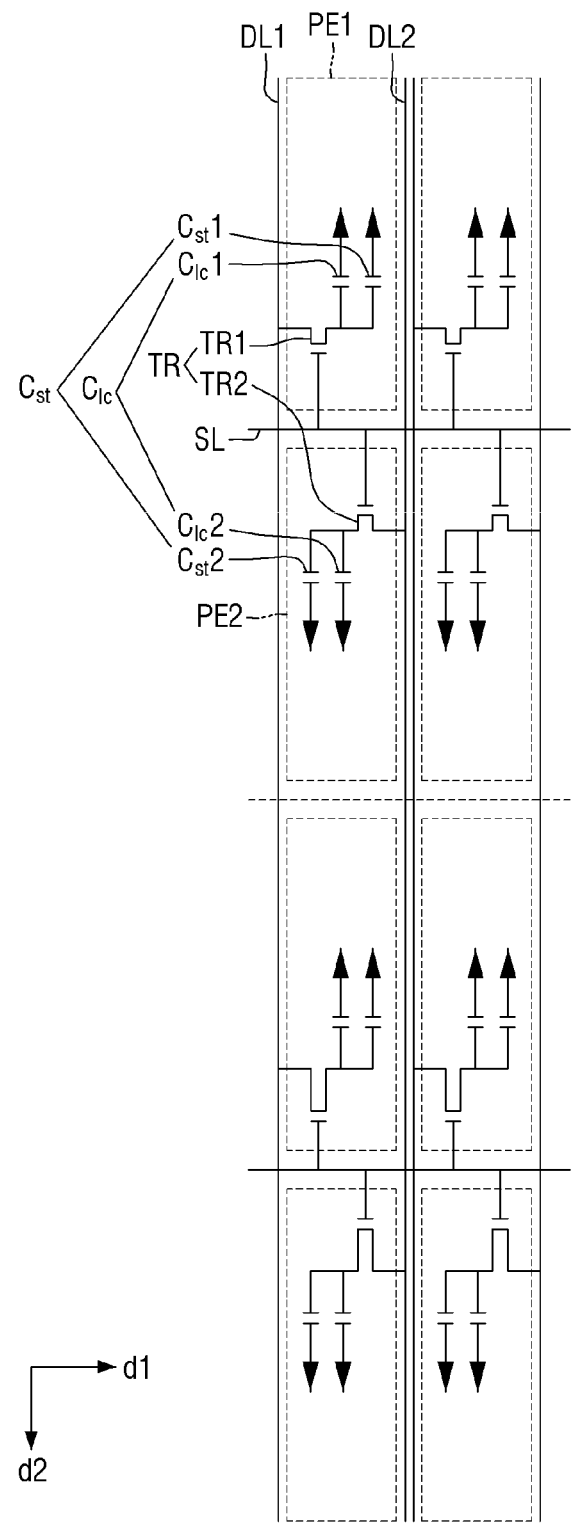
FIG. 2 is an equivalent circuit diagram for illustrating some pixels of FIG. 1.
Figure 3:
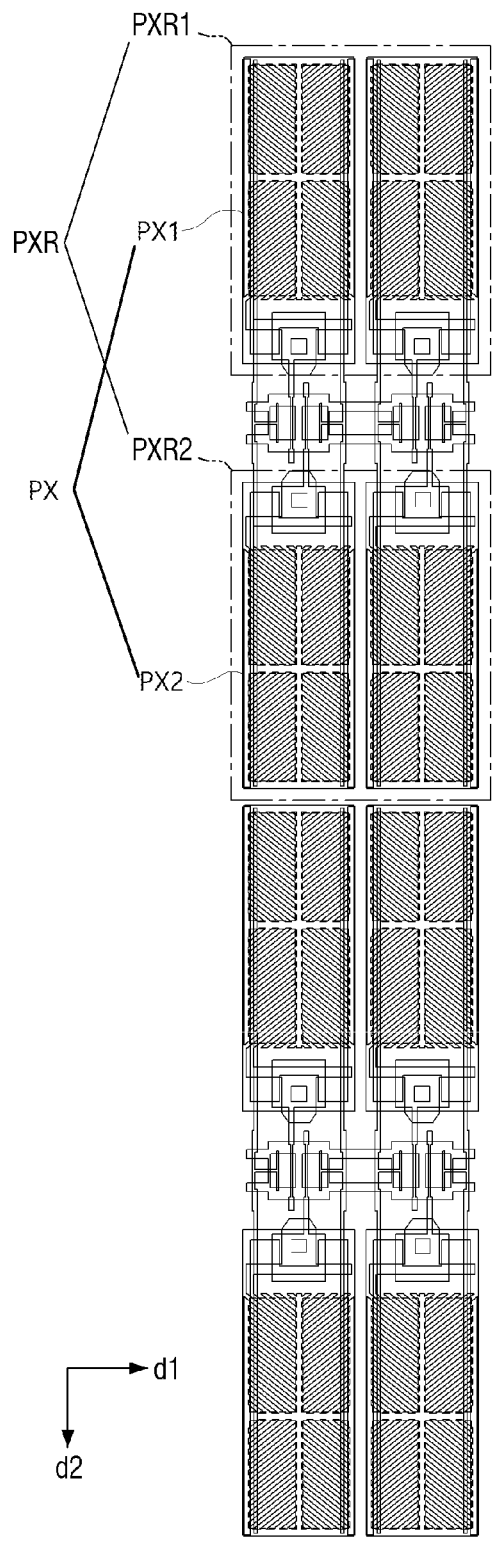
FIG. 3 is a layout view for illustrating a display device according to an exemplary embodiment of the present disclosure.

FIG. 2 is a circuit diagram of some pixels of FIG. 1. FIG. 3 is a layout view for illustrating a display device according to an exemplary embodiment of the present disclosure. FIGS. 2 and 3 illustrate the arrangement of pixels in two rows and two columns which is a portion of a pixel matrix.

Referring to FIGS. 2 and 3, a scan line SL may extend in a first direction d1, and a data line DL may extend in a second direction d2. A pixel electrode PE may be disposed in a region where the scan line SL intersects the data line DL.

One scan line SL may be connected to two adjacent pixel rows PXR. That is, one scan line SL may be shared between two adjacent pixel rows PXR. One scan line SL may be disposed in a space between two pixel rows PXR. The number of scan lines SL may be half the number of pixel rows PXR.

The data line DL may include a first data line DL1, which is disposed on one side (a left side of a plan view) of the pixel electrode PE (or PE1 and PE2) in the first direction d1, and a second data line DL2, which is disposed on the other side (a right side of the plan view) of the pixel electrode PE in the first direction d1. The first data line DL1 may be disposed opposite the second data line DL2 with the pixel electrode PE disposed therebetween. The second data line DL2 at a boundary of the pixel PX may be disposed adjacent to the first data line DL1 of a neighboring pixel PX column, and another pixel electrode PE may not be interposed between the first data line DL1 and the second data line DL2. Throughout the arranged pixels PX, the first data line DL1 and the second data line DL2 may form a pair and be disposed adjacent to each other in spaces between columns of the pixels PX. A total number of data lines DL including both the first data line DL1 and the second data line DL2 may be twice the number of pixel columns.

The pixel row PXR may include a first pixel row PXR1 and a second pixel row PXR2. Pixels (hereinafter, referred to as first pixels PX1) of the first pixel row PXR1 may receive a scan signal from the scan line SL disposed adjacent to one side (a lower side in a plan view) of the first pixel row PXR1 and receive a data signal from data lines disposed on one side (a left side in the plan view). Pixels (hereinafter, referred to as second pixels PX2) of the second pixel row PXR2 may receive a scan signal from the scan line SL disposed adjacent to the other side (an upper side in the plan view) of the second pixel row PXR2 and receive a data signal from data lines disposed on the other side (a right side in the plan view).

The first pixel row PXR1 and the second pixel row PXR2 may be alternately arranged in the second direction d2.

Each of the pixels PX may include a switching element TR (or TR1 and TR2), a pixel electrode PE (PE1 or PE2), a liquid crystal (LC) capacitor Clc (or Clc1 and Clc2), and a storage capacitor Cst (or Cst1 and Cst2).

The switching element TR may include a gate electrode GE electrically connected to the scan line SL, a source electrode SE electrically connected to the data line DL, and a drain electrode DE electrically connected to the pixel electrode PE. The switching element TR may include a TFT.

The switching element TR may perform a switching operation in response to a scan signal provided from the scan line SL and provide a data signal provided from the data line DL to the pixel electrode PE. Here, as described above, the first pixel PX1 included in the first pixel row PXR1 may be electrically connected to the first data line DL1 and receive a first data signal from the first data line DL1, and the second pixel PX2 included in the second pixel row PXR2 may be electrically connected to the second data line DL2 and receive a second data signal from the second data line DL2.

The LC capacitor Clc may be formed between the pixel electrode PE and a common electrode CE provided with a common voltage Vcom. The storage capacitor Cst may be formed between the pixel electrode PE and storage interconnections (refer to 127 and 128 in FIG. 4) provided with a storage voltage Vcst.

Hereinafter, a method of driving the first pixel PX1 and the second pixel PX2 disposed adjacent to the first pixel PX1 along the second direction d2 will be described.

The first switching element TR1 and the second switching element TR2 may perform switching operations in response to the same scan signal. That is, the first switching element TR1 and the second switching element TR2 may perform the same switching operation. However, the first switching element TR1 may be electrically connected to the first data line DL1, while the second switching element TR2 may be electrically connected to the second data line DL2, and thus, different data signals may be respectively provided to a pixel electrode of the first pixel PX1 (hereinafter, referred to as a 'first pixel electrode PE1') and a pixel electrode of the second pixel PX2 (hereinafter, referred to as a 'second pixel electrode PE2'). Thus, the first pixel electrode PE1 and the second pixel electrode PE2 may simultaneously receive different data signals.

For example, when a gate-on voltage is applied to the scan line SL, each of the first switching element TR1 and the second switching element TR2 may be turned on, and the first LC capacitor Clc1 may be charged due to a first data voltage transmitted through the first data line DL1, and the second LC capacitor Clc2 may be charged due to a second data voltage transmitted through the second data line DL2. Here, the first LC capacitor Clc1 may be charged with a difference between the common voltage Vcom and the first data voltage applied through the first data line DL1, and the second LC capacitor Clc2 may be charged with a difference between the common voltage Vcom and the second data voltage applied through the second data line DL2.

That is, the first and second pixels PX1 and PX2 of the two pixel rows, that is, the first and second pixel rows PXR1 and PXR2, may receive scan signals from one scan line SL, and thus, enough charge time may be secured as compared to a case when the first pixel PE1 and the second pixel PE2 receive different scan signals from different scan lines. Accordingly, the above-described structure may be efficiently applied to a high-resolution display device or a high-frequency display device.

Figure 4:
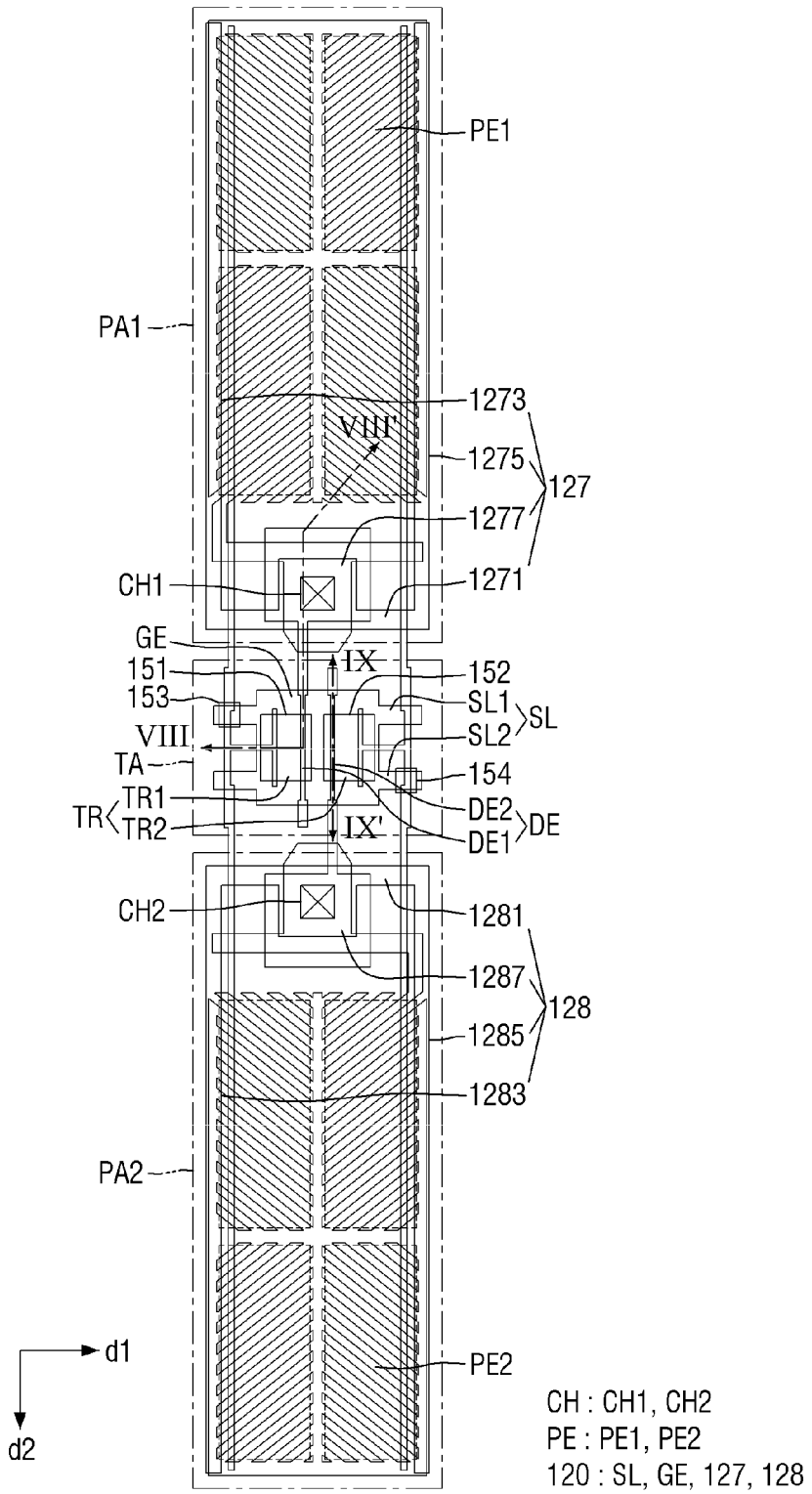
FIG. 4 is an enlarged layout view for illustrating a first pixel and a second pixel of FIG. 3.
Figure 5:
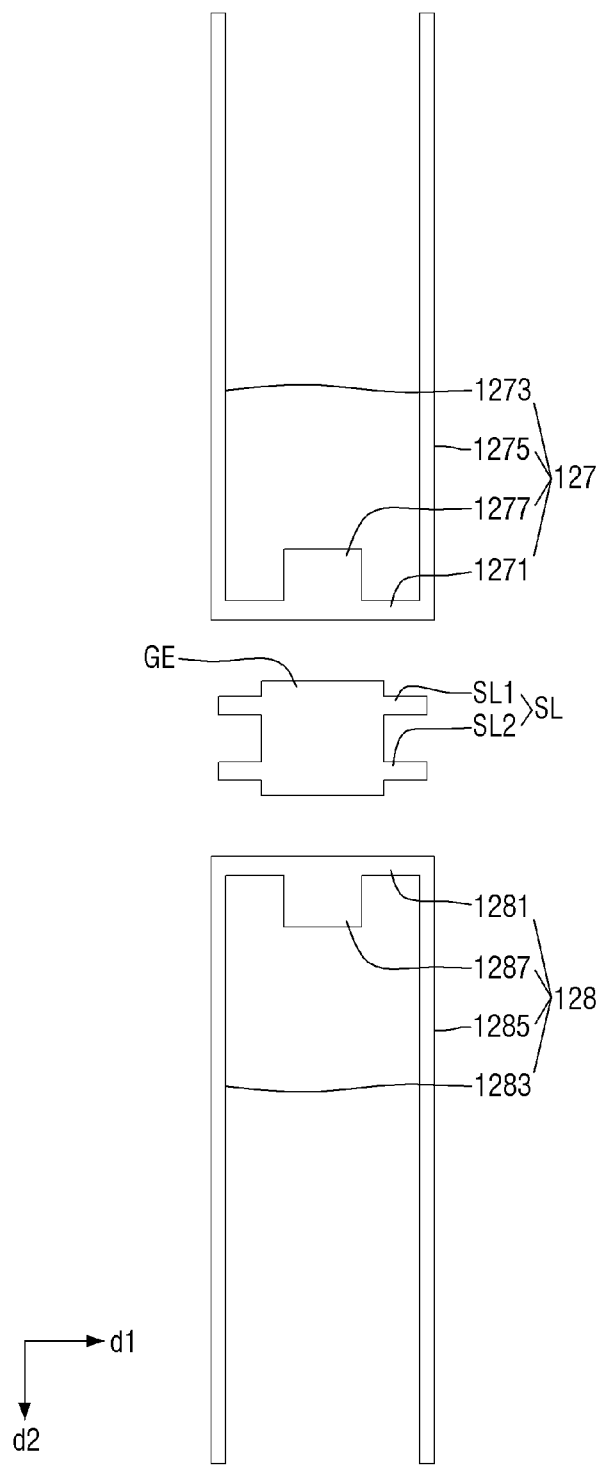
FIG. 5 is a layout view for illustrating a gate conductive layer of FIG. 4.
Figure 6:
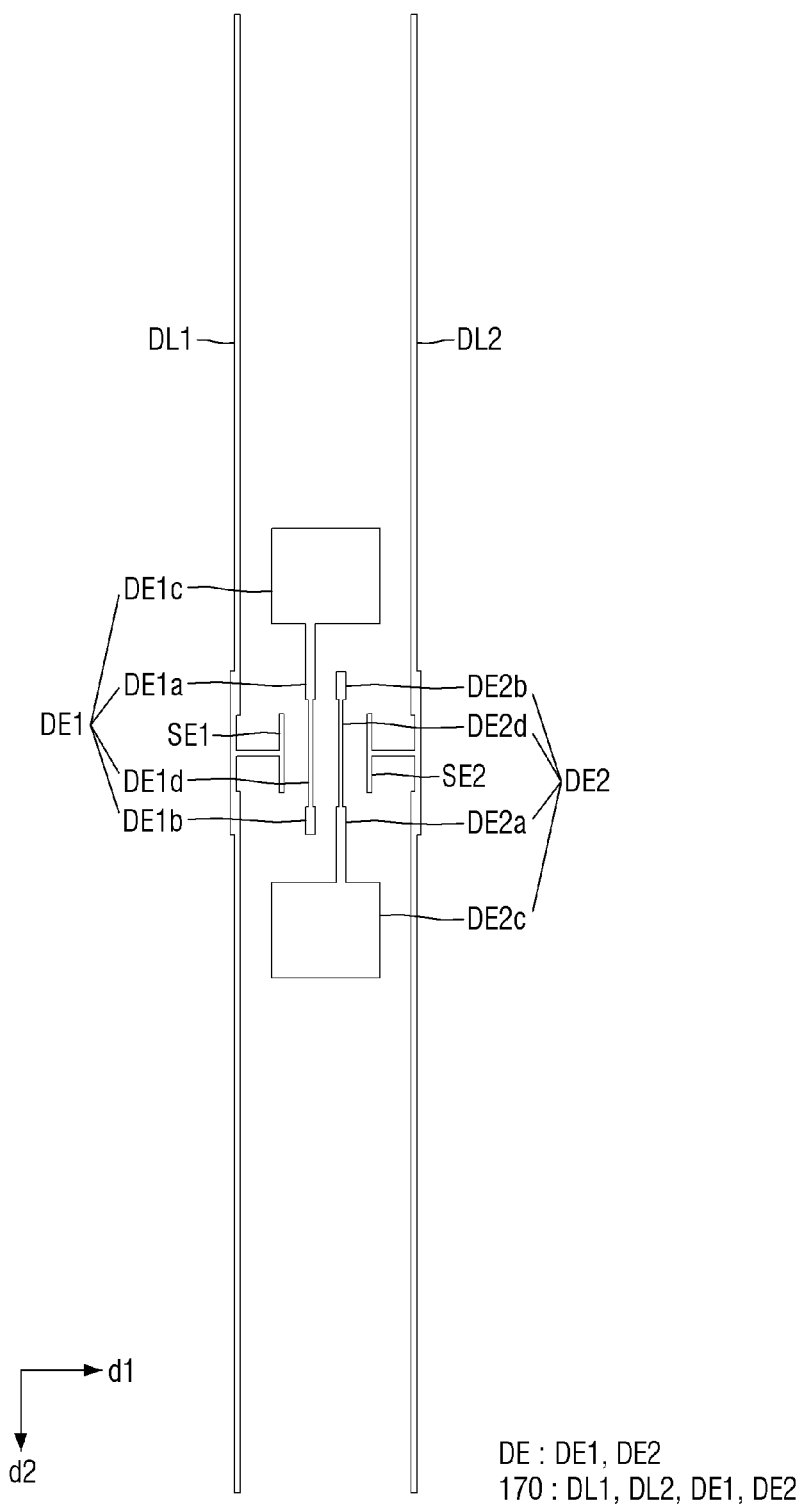
FIG. 6 is a layout view for illustrating a data conductive layer of FIG. 4.
Figure 8:
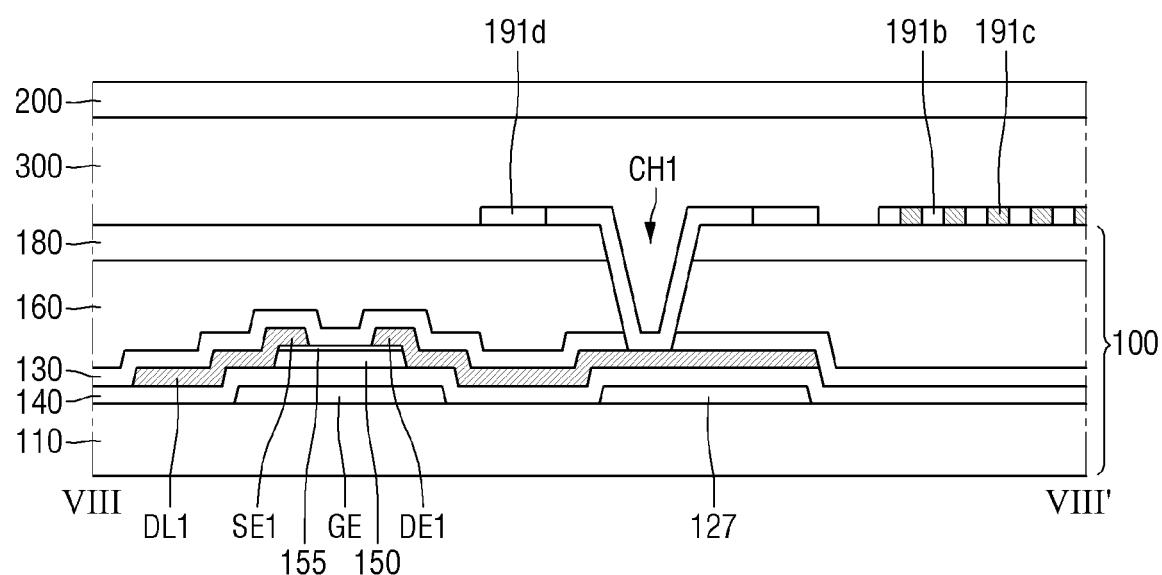
FIG. 8 is a cross-sectional view taken along line VIII-VIII' of FIG. 4.
Figure 9:
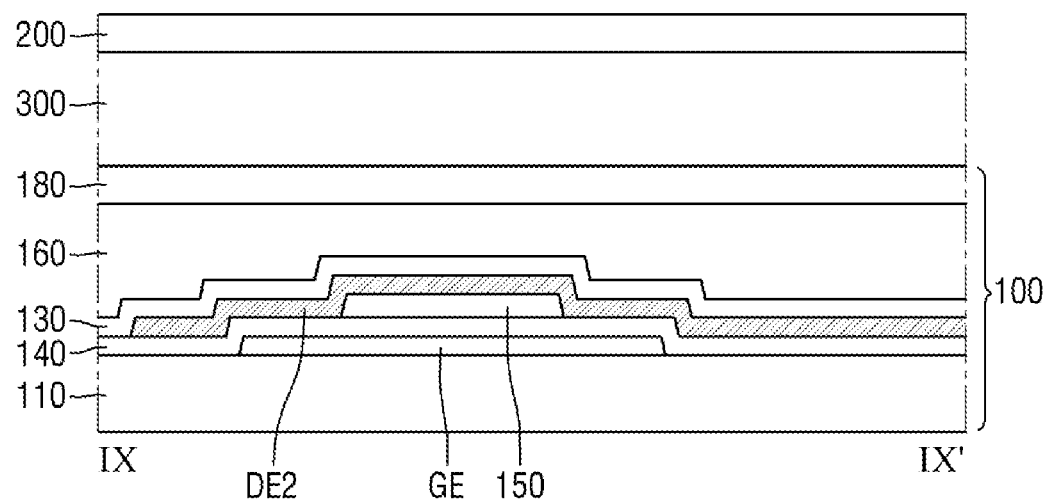
FIG. 9 is a cross-sectional view taken along line IX-IX of FIG. 4.

FIG. 4 is an enlarged layout view of the first pixel and the second pixel of FIG. 3. FIG. 5 is a layout view of a gate conductive layer of FIG. 4. FIG. 6 is a layout view of a data conductive layer of FIG. 4. FIG. 7 is a layout view for illustrating the pixel electrode of FIG. 4. FIG. 8 is a cross-sectional view taken along line VIII-VIII' of FIG. 4. FIG. 9 is a cross-sectional view taken along line IX-IX of FIG. 4.

Referring to FIGS. 4 to 9 with FIG. 3, a display device 1 may include a first display substrate 100, a second display substrate 200, and an LC layer 300. The second display substrate 200 may be opposite to the first display substrate 100, and the LC layer 300 may be disposed between the first display substrate 100 and the second display substrate 200.

The first display substrate 100 may be a TFT array substrate on which switching elements are formed. The second display substrate 200 may be a substrate opposite to the first display substrate 100.

The first display substrate 100 may include a first base substrate 110, a gate conductive layer 120, a gate insulating layer 140, a passivation layer 130, a semiconductor layer 150, a data conductive layer 170, a planarization layer 180, and a pixel electrode layer 190. Also, the first display substrate 100 may further include a color filter 160.

The first base substrate 110 may include an insulating material such as glass, quartz, or polymer resin. A polymer material may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The first base substrate 110 may include a metal material.

A first pixel area PA1, a second pixel area PA2, and a switching element area TA may be defined in the first base substrate 110. The first pixel area PA1 may be an area in which a first pixel electrode PE1 of a first pixel PX1 is disposed, and the second pixel area PA2 may be an area in which a second pixel electrode PE2 is disposed. The switching element area TA may be defined as an area in which a first switching element TR1, a second switching element TR2, and the like are disposed. The switching element area TA may be disposed between the first pixel area PA1 and the second pixel area PA2.

The gate conductive layer 120 may be disposed on the first base substrate 110. The gate conductive layer 120 may include a scan line SL, a gate electrode GE, a first storage interconnection 127 and a second storage interconnection 128. Here, when a predetermined conductive layer is referred to as including predetermined structures, the predetermined structures may be disposed in the same layer and include the same material. Predetermined structures included in one conductive layer may be simultaneously patterned using one mask process and formed.

The scan line SL may extend in a first direction d1. The scan line SL may be disposed in a space between a plurality of pixel rows PXR. The scan line SL may be disposed in every other space between the pixel rows PXR.

The gate electrode GE may be connected to the scan line SL. For example, a plurality of gate electrodes GE may be disposed in each pixel row PXR and may each be connected to the scan line SL. One gate electrode GE may be used as a common gate electrode of the first pixel PX1 and a second pixel PX2 which are adjacent to each other along the second direction.

The scan line SL may include a first sub-scan line SL1 and a second sub-scan line SL2. Each of the first sub-scan line SL1 and the second sub-scan line SL2 may extend in the first direction d1. In the space between the pixel rows PXR, the first sub-scan line SL1 may be disposed on one side (an upper side of a plan view) of the second direction d2 and the second sub-scan line SL2 may be disposed on the other side (a lower side of the plan view) of the second direction d2. The first sub-scan line SL1 may be connected to a region of the gate electrode adjacent to one end portion of the gate electrode GE in the second direction d2 and the second sub-scan line SL2 may be connected to a region of the gate electrode adjacent to the other end portion of the gate electrode GE in the second direction d2. A hole may be interposed between the first sub-scan line SL1 and the second sub-scan line SL2. A boundary of the hole may be defined by the first sub-scan line SL1, the second sub-scan line SL2, and the gate electrodes adjacent each other along the first direction D1.

The gate conductive layer 120 may further include first and second storage interconnections 127 and 128. A storage voltage may be applied to the first and second storage interconnections 127 and 128. The storage voltage may be equal to a common voltage Vcom applied to a common electrode 270 but the voltage applied to the first and second storage interconnections 127 and 128 is not limited thereto.

The first and second storage interconnections 127 and 128 may include center line portions 1271 and 1281 configured to extend in the first direction d1, one-side extensions 1275 and 1285 configured to extend from the center line portions 1271 and 1281 in the second direction d2 and disposed adjacent to one side of a pixel electrode PE in the first direction d1, another-side extensions 1273 and 1283 configured to extend from the center line portions 1271 and 1281 in the second direction d2 and disposed adjacent to another side of the pixel electrode PE in the first direction d1, and protrusions 1277 and 1287 configured to protrude from the center line portions 1271 and 1281 toward the pixel electrode PE. A shape of the first storage interconnection 127 disposed in the first pixel row PXR1 and a shape of the second storage interconnection 128 disposed in the second pixel row PXR2 may be in a line symmetry about the space (or the scan line SL) disposed between the pixel rows PXR.

The center line portions 1271 and 1281 of the first and second storage interconnections 127 and 128 may be disposed to be spaced apart from the scan line SL with a space between the pixel rows PXR. That is, the center line portion 1271 of the first storage interconnection 127 may be disposed on one side of the scan line SL in the second direction d2, while the center line portion 1281 of the second storage interconnection 128 may be disposed on the other side of the scan line SL in the second direction d2. The center line portions 1271 and 1281 may partially overlap the first and second pixel areas PA1 and PA2, respectively.

The one-side extensions 1275 and 1285 and the other-side extensions 1273 and 1283 of the first and second storage interconnections 127 and 128 may not overlap the pixel electrode PE. The one-side extensions 1275 and 1285 and the other-side extensions 1273 and 1283 may function as light-shielding patterns configured to prevent light transmission through both sides of the pixel electrode PE.

The protrusion 1277 of the first storage interconnection 127 may overlap a pad portion DE1c of a first drain electrode DE1 and form a storage capacitance in the first pixel area PA1. Similarly, the protrusion 1287 of the second storage interconnection 128 may overlap a pad portion DE2c of a second drain electrode DE2 and form a storage capacitance in the second pixel area PA2.

In embodiments, the protrusions 1277 and 1287 of the first and second storage interconnections 127 and 128 may have smaller areas than the pad portions DE1c and DE2c of the first and second drain electrodes DE1 and DE2 and be disposed inside edges of the pad portions DE1c and DE2c of the first and second drain electrodes DE1 and DE2 in a plan view. For example, the protrusions 1277 and 1287 of the first and second storage interconnections 127 and 128 may be disposed inside the edges of the pad portions DE1c and DE2c of the first and second drain electrodes DE1 and DE2 in the second direction d2 and disposed inside the edges of the pad portions DE1c and DE2c of the first and second drain electrodes DE1 and DE2 in the first direction d1. That is, the pad portions DE1c and DE2c of the first and second drain electrodes DE1 and DE2 may completely cover the protrusions 1277 and 1287 of the first and second storage interconnections 127 and 128. However, the present disclosure is not limited thereto.

The gate conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The gate conductive layer 120 may include a single film or a multilayer film structure.

The gate insulating layer 140 may be disposed on the gate conductive layer 120. The gate insulating layer 140 may cover the gate conductive layer 120. The gate insulating layer 140 may be disposed over the entire surface on the first base substrate 110.

The gate insulating layer 140 may include an inorganic insulating material such as a silicon compound and a metal oxide. For example, the gate insulating layer 140 may include silicon oxide, silicon nitride, silicon oxynitride, aluminum oxide, tantalum oxide, hafnium oxide, zirconium oxide, titanium oxide, or a combination thereof. The gate insulating layer 140 may include a single film or a multilayer film structure in which different material films are stacked.

The semiconductor layer 150 may be disposed on the gate insulating layer 140. The semiconductor layer 150 may include a plurality of semiconductor patterns which are island-shaped. Specifically, the semiconductor layer 150 may include a first semiconductor pattern 151 and a second semiconductor pattern 152. The first semiconductor pattern 151 may form a channel of a first TFT TR1 configured to provide a first data signal to the first pixel electrode PE1 and the second semiconductor pattern 152 may form a channel of a second TFT TR2 configured to provide a second data signal to the second pixel electrode PX2. The second semiconductor pattern 152 may be disposed to be apart from the first semiconductor pattern 151 in the first direction d1.

The first semiconductor pattern 151 and the second semiconductor pattern 152 may overlap the gate electrode GE. Each of the first semiconductor pattern 151 and the second semiconductor pattern 152 may include a channel region in which a channel is formed by inverting conductive type between a source electrode SE and a drain electrode DE when an electric field is applied to the region by the overlapped gate electrode GE.

The semiconductor layer 150 may further include a third semiconductor pattern 153 and a fourth semiconductor pattern 154. Each of the third semiconductor pattern 153 and the fourth semiconductor pattern 154 may be disposed between the gate insulating layer 140 and the data conductive layer 170.

The third semiconductor pattern 153 may be disposed on a first overlap portion where the first sub-scan line SL1 overlaps the first data line DL1. The fourth semiconductor pattern 154 may be disposed on a second overlap portion where the second sub-scan line SL2 overlaps the second data line DL2. The third semiconductor pattern 153 and the fourth semiconductor pattern 154 may have greater areas than the first and second overlap portions where the first and second sub-scan lines SL1 and SL2 overlap the first and second data lines DL1 and DL2, respectively. The third semiconductor pattern 153 and the fourth semiconductor pattern 154 may completely cover the first overlap portion and the second overlap portion, respectively. Accordingly, even if a misalignment between the semiconductor layer 150 and the data conductive layer 170 is occurred, the third and fourth semiconductor patterns 153 and 154 may reliably overlap with the first data line DL1 and the second data line DL2, respectively.

With the scaling-up of the display device 1, lengths (i.e., extended lengths in a plan view) of the first and second data lines DL1 and DL2 (and/or the scan line SL) may be increased, and thus, resistances of the first and second data lines DL1 and DL2 may increase, and signals may be attenuated and delayed. To reduce resistances of the first and second data lines DL1 and DL2, a thickness of the first and second data lines DL1 and DL2 may be increased. The third and fourth semiconductor patterns 153 and 154 may overlap with the first and second data lines DL1 and DL2, thereby mitigating or eliminating defects (e.g., interference, disconnection, and the like) caused by the increased thicknesses of the first and second data lines DL1 and DL2.

Although not shown, a semiconductor pattern may be disposed also on an overlap portion between the second sub-scan line SL2 and the first data line DL1 or an overlap portion between the first sub-scan line SL1 and the second data line DL2. The semiconductor pattern may completely cover the overlap portion between the second sub-scan line SL2 and the first data line DL1 and the overlap portion between the first sub-scan line SL1 and the second data line DL2. Accordingly, even if the misalignment between the semiconductor layer 150 and the data conductive layer 170 is occurred, the first data line DL1 and the second data line DL2 may be reliably overlap with the semiconductor layer 150.

In an embodiment, the semiconductor layer 150 may include a silicon-based semiconductor material such as amorphous silicon, polycrystalline silicon, or single-crystalline silicon. In another embodiment, the semiconductor layer 150 may include single-crystalline silicon, low-temperature polycrystalline silicon, amorphous silicon, or the like. However, the present disclosure is not limited thereto, and the semiconductor layer 150 may include an oxide semiconductor. For example, the semiconductor layer 150 may include a binary compound ($AB_x$), a ternary compound ($AB_xC_y$), or a quaternary compound ($AB_xC_yD_z$) containing indium (In), zinc (Zn), gallium (Ga), tin (Sn), titanium (Ti), aluminum (Al), hafnium (Hf), zirconium (Zr), magnesium (Mg), or the like. The semiconductor layer 150 may include an oxide including indium, tin, and zinc (ITZO) or an oxide including indium, gallium, and zinc (IGZO).

The data conductive layer 170 may be disposed on the gate insulating layer 140 and the semiconductor layer 150. The data conductive layer 170 may be formed using a different mask from a mask for forming the semiconductor layer 150. Accordingly, a portion of the data conductive layer 170 may be in direct contact with the gate insulating layer 140. Further, another portion of the data conductive layer 170 may be in contact with a side surface of at least one (e.g., the first semiconductor pattern 151) of components of the semiconductor layer 150. In the pixel PX, an area occupied by the data conductive layer 170 may be greater than an area occupied by the semiconductor layer 150.

The data conductive layer 170 may include a first data line DL1, a second data line DL2, first and second source electrodes SE1 and SE2, and first and second drain electrodes DE1 and DE2.

The first data line DL1 and the second data line DL2 may generally extend in the second direction d2. The first data line DL1 and the second data line DL2 may partially overlap the first pixel electrode PE1 and the second pixel electrode PE2.

The source electrode SE may include the first source electrode SE1 connected to the first data line DL1 and the second source electrode SE2 connected to the second data line DL2. The first and second source electrodes SE1 and SE2 may be disposed on the first and second semiconductor patterns 151 and 152 to overlap the first and second semiconductor patterns 151 and 152. The first and second source electrodes SE1 and SE2 may include a lateral extension connected to the data line DL and configured to extend in the first direction d1 from the data line DL and a vertical extension configured to extend to both sides of the second direction d2 from an end portion of the lateral extension.

The drain electrode DE may include the first drain electrode DE1 connected to the first pixel electrode PE1 and the second drain electrode DE2 connected to the second pixel electrode PE2. The first drain electrode DE1 may be disposed on the first semiconductor pattern 151 to face the first source electrode SE1 and be spaced apart from the first source electrode SE1 at a predetermined distance, for example, a channel length of the first TFT TR1. The second drain electrode DE2 may be disposed on the second semiconductor pattern 152 to face the second source electrode SE2 and be spaced apart from the second source electrode SE2 at a predetermined distance, for example, a channel length of the second TFT TR2. Detailed descriptions of the first drain electrode DE1 and the second drain electrode DE2 will be provided below.

Although not shown, resistive contact layers may be further interposed between the source electrode SE and the drain electrode DE and the first and second semiconductor patterns 151 and 152, respectively.

The data conductive layer 170 may include at least one metal selected from the group consisting of aluminum (Al), platinum (Pt), palladium (Pd), silver (Ag), magnesium (Mg), molybdenum (Mo), gold (Au), nickel (Ni), neodymium (Nd), iridium (Ir), chromium (Cr), titanium (Ti), tantalum (Ta), tungsten (W), and copper (Cu). The data conductive layer 170 may include a single film or a multilayer film structure. For example, the data conductive layer 170 may have a stack structure including, for example, Ti/Al/Ti, Mo/Al/Mo, Mo/AlGe/Mo, Ti/Cu, or the like.

The passivation layer 130 may be disposed on the data conductive layer 170. The passivation layer 130 may be disposed over the entire surface on the first base substrate 110 except contact holes formed through the passivation layer 130 to connect the first drain electrode DE1 and the second drain electrode DE2 to the first pixel electrode PE1 and the second pixel electrode PE2, respectively. In an embodiment, the passivation layer 130 may include an inorganic insulating material such as silicon nitride, silicon oxide or a combination thereof. The passivation layer 130 may prevent a pigment of the later-described color filter 160 from flowing into the semiconductor layer 150.

The color filter 160 may be disposed on the passivation layer 130. A color of the color filter 160 may be any one of red, green, and blue, but the color of the color filter 160 is not limited thereto. The color filter 160 may be disposed in a pixel area PA and overlap the pixel electrode PE. Furthermore, the color filter 160 may be further disposed in the switching element area TA and overlap the switching element TR.

The planarization layer 180 may be disposed on the color filter 160. The planarization layer 180 may include an organic material having photosensitivity and excellent planarization characteristics. The planarization layer 180 may fill a step due to an underlying structure (e.g., the color filter 160) and planarize a surface on which the pixel electrode PE is disposed. However, the present disclosure is not limited thereto, and any one of the planarization layer 180 and the color filter 160 may be omitted.

First and second contact holes CH1 and CH2 exposing portions of the drain electrodes DE1 and DE2 may be formed in the planarization layer 180, the color filter 160, and the passivation layer 130. The portion exposed by the first contact hole CH1 may be the pad portion DE1c of the first drain electrode DE1 and the portion exposed by the second contact hole CH2 may be the pad portion DE2c of the second drain electrode DE2.

The pixel electrode layer PE may be disposed on the planarization layer 180. The pixel electrode layer PE may include a first pixel electrode PE1 and a second pixel electrode PE2.

The first and second pixel electrodes PE1 and PE2 may be electrically connected to and in contact with the first and second drain electrodes DE1 and DE2 through the first and second contact holes CH1 and CH2, respectively.

The first and second pixel electrode PE1 and PE2 may respectively include first and second stem portions 191a and 192a, a plurality of first and second branch portions 191b and 192b configured to extend outward from the first and second stem portions 191a and 192a to be spaced apart from each other with slits 191c and 192c therebetween, and extensions 191d and 192d configured to extend to the switching element area TA.

Each of the stem portions 191a and 192a may include a lateral stem portion configured to generally extend in the first direction d1 and a vertical stem portion configured to generally extend in the second direction d2. The stem portions 191a and 192a may divide the pixel electrode PE into sub-areas, for example, domains. Each of the stem portions 191a and 192a may be provided in a cross shape. In this case, the pixel electrode PE may be divided into four sub-areas (or four domains) by the stem portions 191a and 192a. The branch portions 191b and 192b disposed in each of the sub-areas may extend in different directions. For example, referring to FIG. 7, the first branch portion 191b disposed in an upper-right sub-area may obliquely extend in a right-upward direction from the first stem portion 191a, and the first branch 191b disposed in a lower-right sub-area may obliquely extend from the in a right-downward direction from the first stem portion 191a. Further, the first branch portion 191b disposed in an upper right sub-area may obliquely extend in a left-upward direction from the first stem portion 191a, and the first branch portion 191b disposed in a lower left sub-area may obliquely extend in a left-downward direction from the first stem portion 191a.

The extensions 191d and 192d may respectively extend from the first and second stem portions 191a and 192a or the first and second branch portions 191b and 192b to the switching element area TA and be connected to the first and second drain electrodes DE1 and DE2 through the first and second contact holes CH1 and CH2, respectively.

The pixel electrode PE may overlap the first data line DL1 and the second data line DL2. Portions of the first data line DL1 and the second data line DL2, which are disposed in the first and second pixel areas PA1 and PA2, may be completely overlapped with the first and second pixel electrodes PE1 and PE2, respectively.

The pixel electrode layer PE may include a transparent conductive material. For example, the pixel electrode layer PE may include a transparent conductive oxide (TCO) film such as indium tin oxide (ITO), indium zinc oxide (IZO), zinc oxide (ZO), or the like.

The second display substrate 200 may be disposed opposite to the first display substrate 100. Although a specific illustration of the second display substrate 200 is omitted, the second display substrate 200 may include a second base substrate, which is an insulating substrate, like the first base substrate 110 and further include a black matrix, an overcoating layer, and a common electrode which are disposed on the second base substrate.

The LC layer 300 may be interposed between the first display substrate 100 and the second display substrate 200. The LC layer 300 may include LC molecules having dielectric anisotropy. When an electric field is applied between the pixel electrode PE disposed on the first display substrate 100 and the common electrode CE disposed on the second display substrate 200, the LC molecules may rotate in a predetermined direction between the first display substrate 100 and the second display substrate 200 to adjust a phase retardation value of light passing through the LC layer 300. The amount of polarized light (e.g., light that has passed through a lower polarizing member) passing through an upper polarizing member may depend on the phase retardation value caused by the rotation of the LC molecules, and a transmittance may be controlled by adjusting the amount of the polarized light. Here, the upper polarizing member may be disposed on an emission side, for example, adhered to an outer surface of the second display substrate 200.

Hereinafter, the arrangement of the first and second switching elements TR1 and TR2 will be described in further detail with reference to FIG. 10.

Figure 10:
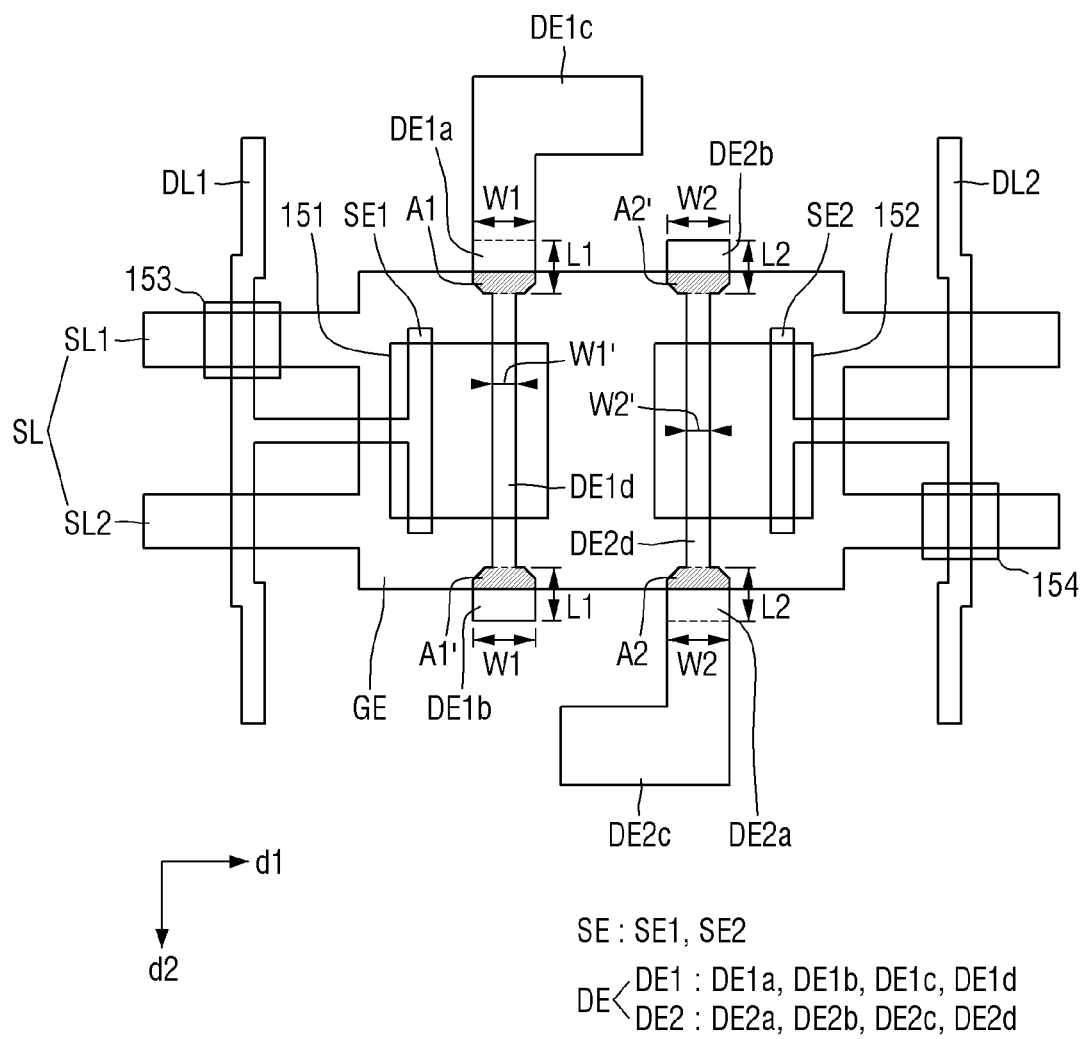
FIG. 10 is an enlarged view for illustrating a switching element region of FIG. 4.

FIG. 10 is an enlarged view for illustrating a switching element region of FIG. 4.

Referring to FIG. 10, a first drain electrode DE1 may include a first bar-shaped portion DE1$d$ which faces a vertical extension of a first source electrode SE1, has a uniform width and extends in a second direction d2, a first connecting portion DE1$a$ which extends by a first length L1 from one distal end portion of the first bar-shaped portion DE1$d$ along the second direction d2, a first pad portion DE1$c$ which is connected to the first connecting portion DE1$a$, extends from one side of the first connecting portion DE1$a$ and overlaps a portion of a first pixel electrode PE1, and a first compensation portion DE1$b$ which extends by the first length L1 from the other distal end portion of the first bar-shaped portion DE1$d$ in a direction opposite to the direction in which the first connecting portion DE1$a$ extends along the second direction d2. The first pad portion DE1$c$ may extend substantially perpendicular to the direction in which the first connecting portion DE1$a$ extends toward a center line bisecting the pixel electrode into two regions disposed along a first direction D1.

A second drain electrode DE2 may include a second bar-shaped portion DE2$d$ which faces a vertical extension of a second source electrode SE2, has a uniform width, and extends in the second direction d2, a second connecting portion DE2$a$ which extends by a second length L2 from one distal end portion of the second bar-shaped portion DE2$d$ to along the second direction d2, a second pad portion DE2$c$ which is connected to the second connecting portion DE2$a$ and extends from one side of the second connecting portion DE2$a$ and overlaps a portion of a second pixel electrode PE2, and a second compensation portion DE2$b$, which extends by the second length L2 from the other distal end portion of the bar-shaped portion DE2$d$ to in a direction opposite to the direction in which the second connecting portion DE2$a$ extends along the second direction d2. The second pad portion DE2$c$ may extend substantially perpendicular to the direction in which the second connecting portion DE2$a$ extends toward a center line bisecting the pixel electrode into two regions disposed along a first direction D1.

More specifically, the first bar-shaped portion DE1$d$ of the first drain electrode DE1 may be disposed on a first semiconductor pattern 151 to overlap the first semiconductor pattern 151 and extend generally parallel to the second direction d2. The first bar-shaped portion DE1$d$ may face the vertical extension of the first source electrode SE1 A length of the first bar-shaped portion DE1$d$ may be greater than or equal to a length of the vertical extension of the first source electrode SE1. For example, both end portions of the first bar-shaped portion DE1$d$ may be disposed to correspond to both end portions of the vertical extension of the first source electrode SE1 in the second direction or the both end portions of the first bar-shaped portion DE1$d$ may extends more than the both end portions of the vertical extension of the first source electrode SE1 along the second direction d2. Further, the first bar-shaped portion DE1$d$ may extend to both outer sides of the first semiconductor pattern 151 in the second direction d2. The first bar-shaped portion DE1$d$ may have a uniform first width W1' along the first direction d1.

At least a portion of the first connecting portion DE1$a$ connected to one side of the first bar-shaped portion DE1$d$ in the second direction d2 may have a second width W1, which is greater than the first width W1'. For example, one distal end portion (a lower side in a plan view) of the first connecting portion DE1$a$ disposed on the one side of the first bar-shaped portion DE1$d$ in the second direction d2 may have the same first width W1' as the first bar-shaped portion DE1$d$, while the other distal end portion (an upper side in the plan view) thereof may have the second width W1 greater than a width of the first bar-shaped portion DE1$d$. In an embodiment, the second width W1 may range from 3 μm to 5 μm, and the first width W1' may be 2 μm or more and may be smaller than the second width W1, but the first width W1' and the second width W1 in the present disclosure is not limited thereto. The first connecting portion DE1$a$ may have a uniform width or increase toward another side of the second direction d2. At least a portion of the first connecting portion DE1$a$ of the first drain electrode DE1 may overlap the gate electrode GE. In an embodiment, one end portion of the first connecting portion DE1$a$ may be disposed to overlap the gate electrode GE, and another end portion of the first connecting portion DE1$a$ may be disposed not to overlap the gate electrode GE.

The first compensation portion DE1$b$ connected to the other side of the first bar-shaped portion DE1$d$ in the second direction d2 may have a symmetrical shape to that of the first connecting portion DE1$a$ connected to the one distal end of the first bar-shaped portion DE1$d$. That is, one distal end portion of the first compensation portion DE1$b$ may have the same first width W1' as the first bar-shaped portion DE1$d$, and the other distal end portion thereof may have the second width W1, which is greater than a width of the first bar-shaped portion DE1$d$. A width of the first compensation portion DE1$b$ may be uniform or increase toward one side of the second direction d2. At least a portion of the first compensation portion DE1$b$ of the first drain electrode DE1 may overlap the gate electrode GE. In an embodiment, one end portion of the first compensation portion DE1$b$ may be disposed to overlap the gate electrode GE, and the other end portion of the first compensation portion DE1$b$ may be disposed not to overlap the gate electrode GE.

The second drain electrode DE2 may have a generally point-symmetrical shape to that of the first drain electrode DE1.

Specifically, the second bar-shaped portion DE2*d* of the second drain electrode DE2 may be disposed on the second semiconductor pattern 152 and extend generally parallel to the second direction d2. The second bar-shaped portion DE2*d* may face the vertical extension of the second source electrode SE2. A length of the second bar-shaped portion DE2*d* may be greater than or equal to a length of the vertical extension of the second source electrode SE2. For example, both end portions of the second bar-shaped portion DE2*d* may be disposed to correspond to both end portions of the vertical extension of the second source electrode SE2 in the second direction or the both end portions of the second bar-shaped portion DE2*d* may extends more than the both end portions of the vertical extension of the second source electrode SE2 in the second direction d2. Further, the second bar-shaped portion DE2*d* may extend to both outer sides of the second semiconductor pattern 152 in the second direction d2. The second bar-shaped portion DE2*d* may have a uniform third width W2' along the first direction d1.

At least a portion of the second connecting portion DE2*a* disposed on one side of the second bar-shaped portion DE2*d* in the second direction d2 may have a fourth width W2, which is greater than the third width W2'. For example, one distal end portion (an upper side on a plan view) of the second connecting portion DE2*a* connected to one distal end portion of the second bar-shaped portion DE2*d* in the second direction d2 may have the same third width W2' as the second bar-shaped portion DE2*d*, while the other distal end portion (a lower side on the plan view) thereof may have the fourth width W2 greater than a width of the second bar-shaped portion DE2*d*. In an embodiment, the fourth width W2 may range from 3 μm to 5 μm, and the third width W2' may be 2 μm or more and has a width smaller than the fourth width W2, but the third width W2' and the fourth width W2 in present disclosure is not limited thereto. A width of the second connecting portion DE2*a* may have a uniform width or increase toward one side of the second direction d2. At least a portion of the second connecting portion DE2*a* of the second drain electrode DE2 may overlap the gate electrode GE. In an embodiment, one end portion of the second connecting portion DE2*a* may be disposed to overlap the gate electrode GE, and another end portion of the second connecting portion DE2*a* may be disposed not to overlap the gate electrode GE.

The second compensation portion DE2*b* disposed on the other side of the second bar-shaped portion DE2*d* in the second direction d2 may have a symmetrical shape to that of the second connecting portion DE2*a* connected to one distal end of the second bar-shaped portion DE2*d*. That is, one distal end portion of the second compensation portion DE2*b* may have the same third width W2' as the second bar-shaped portion DE2*d* and another distal end portion thereof may have the fourth width W2 which is greater than a width of the second bar-shaped portion DE2*d*. A width of the second compensation portion DE2*b* may be uniform or increase toward another side of the second direction d2. At least a portion of the second compensation portion DE2*b* of the second drain electrode DE2 may overlap the gate electrode GE. In an embodiment, one end portion of the second compensation portion DE2*b* may be disposed to overlap the gate electrode GE, and the other end portion of the second compensation portion DE2*b* may be disposed not to overlap the gate electrode GE.

The first connecting portion DE1*a* and the first compensation portion DE1*b* of the first drain electrode DE1 described above may be symmetrical about a line extending in the first direction d1 and have the same area. Similarly, the second connecting portion DE2*a* and the second compensation portion DE2*b* of the second drain electrode DE2 may be symmetrical about a line extending in the first direction d1 and have the same area.

Although regions A1 and A2 where the connecting portions DE1*a* and DE2*a* of the drain electrodes DE1 and DE2 overlap the gate electrode GE may have the same areas as regions A1' and A2' where the compensation portions DE1*b* and DE2*b* of the drain electrodes DE1 and DE2 overlap the gate electrode GE. In some cases, the regions A1 and A2 may have different areas from the regions A1' and A2'. Specifically, the data conductive layer 170 may be formed using a mask different from a mask for forming the semiconductor layer 150. The data conductive layer 170 may be misaligned with the semiconductor layer 150, or alignment between the data conductive layer 170 and the semiconductor layer 150 may be changed depending on a process error. When the data conductive layer 170 is shifted to one side or another side of the second direction d2, the respective areas of the overlap regions described above may be different. Because the connecting portions DE1*a* and DE2*a* have symmetrical shapes to those of the compensation portions DE1*b* and DE2*b*, the sum of the areas of the overlap regions may be maintained to be the same. A further detailed description will be described with reference to FIG. 11.

Figure 11:
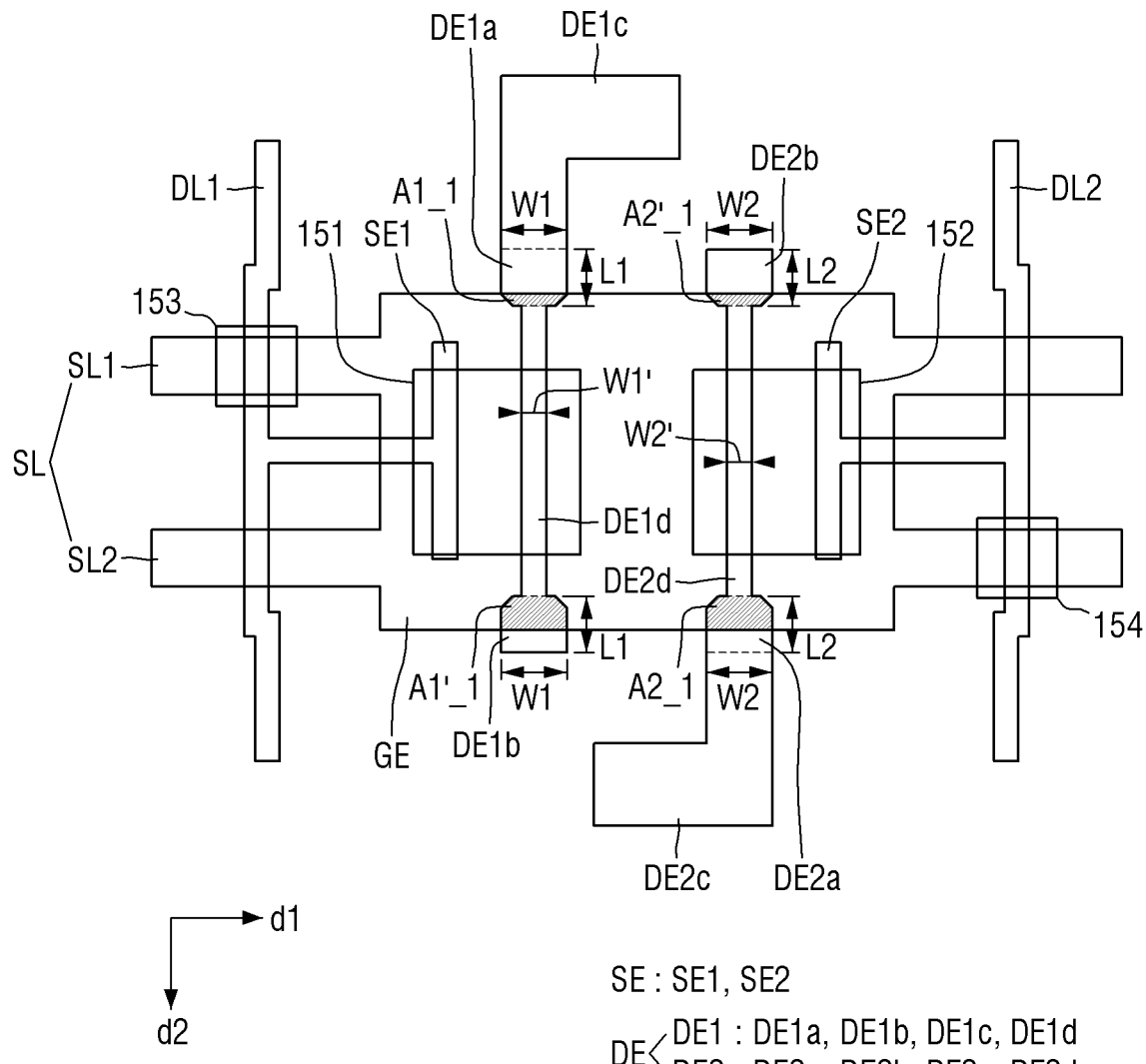
FIG. 11 is a layout view for illustrating a modified example of FIG. 10.

FIG. 11 is a layout view for illustrating a modified example of FIG. 10. Specifically, as compared to FIG. 10, FIG. 11 illustrates a state in which a data conductive layer 170 is shifted to one side (or an upper side of a plan view) of a second direction d2. A case in which the data conductive layer 170 is shifted by as much as linewidths W1' and W2' (e.g., about 2 μm) of bar-shaped portions DE1*d* and DE2*d* to the one side of the second direction d2 will be described below.

When the data conductive layer 170 is shifted to the one side of the second direction d2, a source electrode SE and a drain electrode DE may be shifted to the one side of the second direction d2. In this case, a channel width and a channel length of a switching element TR may not be changed. This is because the switching element TR has an "I"-shaped channel and the source electrode SE and the drain electrode DE are formed to extend outside first and second semiconductor patterns 151 and 152.

As shown in FIG. 11, even if the drain electrode DE is shifted to the one side of the second direction d2, the drain electrode DE may protrude by as much as a predetermined length from a gate electrode GE to the one side and the other side of the second direction d2.

An area of a region A1_1 where a first connecting portion DE1*a* of a first drain electrode DE1 overlaps the gate electrode GE in a shifted state, which is a misaligned state, may be smaller than an area of a region A1 where the first connecting portion DE1*a* of the first drain electrode DE1 overlaps the gate electrode GE in a normal state, which is not a misaligned state. In contrast, an area of a region A1'_1 where a first compensation portion DE1*b* of the first drain electrode DE1 overlaps the gate electrode GE in the shifted state may be greater than an area of a region A1' where the first compensation portion DE1*b* of the first drain electrode DE1 overlaps the gate electrode GE in the normal state. Because the first connecting portion DE1*a* has a symmetrical shape to that of the first compensation portion DE1*b*, the sum of the areas of the regions where the first connecting portion DE1*a* and the first compensation portion DE1*b* of the first drain electrode DE1 overlap the gate electrode GE in a normal state (A1+A1') may be the same as in a shifted state (A1_1+A1'_1).

An area of a region A2_1 where a second connecting portion DE2a of a second drain electrode DE2 overlaps the gate electrode GE in a shifted state may be greater than an area of a region A2 wherein a connecting portion DE2a of the second drain electrode DE2 overlaps the gate electrode G3 in a normal state. An area of a region A2'_1 where a compensation portion DE2b of the second drain electrode DE2 overlaps the gate electrode GE in the shifted state may be smaller than an area of a region A2' where a compensation portion DE2b of the second drain electrode DE2 overlaps the gate electrode G3 in the normal state. However, the sum of the areas of the regions where the connecting portion DE2a and the compensation portion DE2b of the second drain electrode DE2 overlap the gate electrode GE in a normal state (A2+A2') may be the same as in the shifted state (A2_1+A2'_1).

Variations in gate capacitances Cgs of a first switching element TR1 and a second switching element TR2 (i.e., a parasitic capacitance formed due to overlap between the gate electrode GE and the data conductive layer 170) may lead to variations in kickback voltages Vkb of the first switching element TR1 and the second switching element TR2. Equation 1 shows a relationship between the gate capacitance Cgs and the kickback voltage Vkb.

$$Vkb = \frac{Cgs}{Cst + Clc + Cgs} \times (Von - Voff). \qquad (1)$$

Further, a dispersion (or a non-uniform distribution) of kickback voltages Vkb of pixels PX may cause a residual image in a display image or worsen the visibility of the display image. In this regards, the gate capacitance Cgs of the first switching element TR1 and the second switching element TR2 will be described.

A capacitance may be proportional to an overlap area of a parallel plate and inversely proportional to a distance of the parallel plate. Accordingly, the gate capacitance Cgs may be proportional to an overlap area between the gate electrode GE and the drain electrode DE because the distance of the parallel plate is fixed.

As in the description of the gate capacitance Cgs of the switching element TR with reference to FIGS. 10 and 11, even if the data conductive layer 170 is shifted to one side of the second direction d2, the sum of the areas A1_1+A1'_1 and A2_1+A2'_1 of the regions where the drain electrodes DE1 and DE2 overlap the gate electrode GE in the shifted state may be equal to the sum of the areas A1+A1' and A2+A2' of the regions where the drain electrodes DE1 and DE2 overlap the gate electrode GE in the normal state.

Accordingly, the gate capacitance Cgs of the switching element TR may not be changed. The drain electrode DE may be disposed to protrude by a predetermined length or more to the outside of the gate electrode GE, and even if the data conductive layer 170 is shifted to one side of the second direction d2, an overlap area lost on the one side of the second direction d2 and an overlap area newly created on the other side of the second direction d2 may be equal and counterbalance each other.

When the data conductive layer 170 is shifted to the other side of the second direction d2, the first drain electrode DE1 may be shifted to the other side of the second direction d2. In this case, only a shifted direction is opposite as compared to a case in which the data conductive layer 170 is shifted to the one side of the second direction d2, the same description as described above may be applied thereto.

Meanwhile, the data conductive layer 170 may be also shifted to one side or the other side of the first direction d1. In a plan view, the first and second semiconductor patterns 151 and 152 may completely cover source electrodes SE1 and SE2 and the drain electrodes DE1 and DE2 of the first and second switching elements TR1 and TR2 in the first direction d1 with sufficient margins. Accordingly, even if a misalignment between the first and second semiconductor patterns 151 and 152 and the data conductive layer 170 occurs to one side or the other side of the first direction d1, a channel width and a channel length of each of the first and second switching elements TR1 and TR2 may not be changed.

In a plan view, the gate electrode GE may completely cover the drain electrodes DE1 and DE2 of the first and second switching elements TR1 and TR2 with sufficient margins in the first direction d1 and the second direction d2. Accordingly, even if a misalignment between the gate electrode GE and the data conductive layer 170 occurs, the gate capacitances Cgs of the first and second switching elements TR1 and TR2 may not be changed.

Even if a process variation occurs due to the above-described structure, the gate capacitances Cgs of the first and second switching elements TR1 and TR2 may not be changed but may be maintained to be constant, and thus, the kickback voltages Vkb of the first and second switching elements TR1 and TR2 may be maintained to be constant. Accordingly, a residual image and visibility degradation of a display image due to the variation of the kickback voltage Vkb may be prevented.

Figure 12:
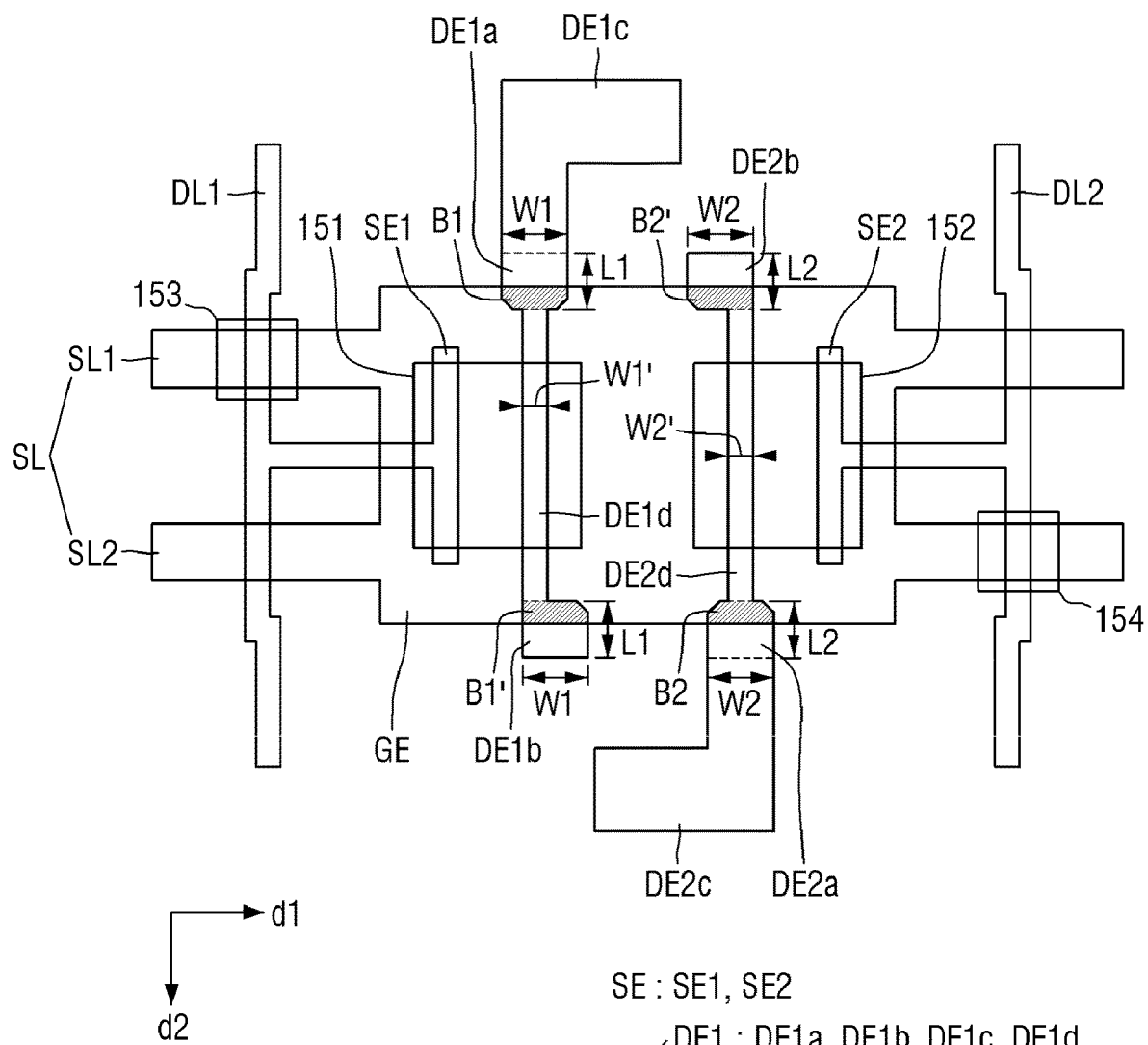
FIG. 12 is a layout view for illustrating a display device according to another exemplary embodiment of the present disclosure.

FIG. 12 is a layout view for illustrating a display device according to another exemplary embodiment of the present disclosure. Specifically, as compared to FIG. 10, FIG. 12 illustrates an example in which shapes of a compensation portion DE1b of a first drain electrode DE1 and a compensation portion DE2b of a second drain electrode DE2 are modified. The present embodiment shows that even if the compensation portions DE1b and DE2b are not perfectly symmetrical to connecting portions DE1a and DE2a, effective compensation for an overlap area between a gate electrode GE and a drain electrode DE may be achieved.

Referring to FIG. 12, an area where the connecting portion DE1a of the first drain electrode DE1 overlaps the gate electrode GE may be B1 and an area where the compensation portion DE1b overlaps the gate electrode GE may be B1'. An area where the connecting portion DE2a of the second drain electrode DE2 overlaps the gate electrode GE may be B2, and an area where the compensation portion DE2b overlaps the gate electrode GE may be B2'.

Figure 13:
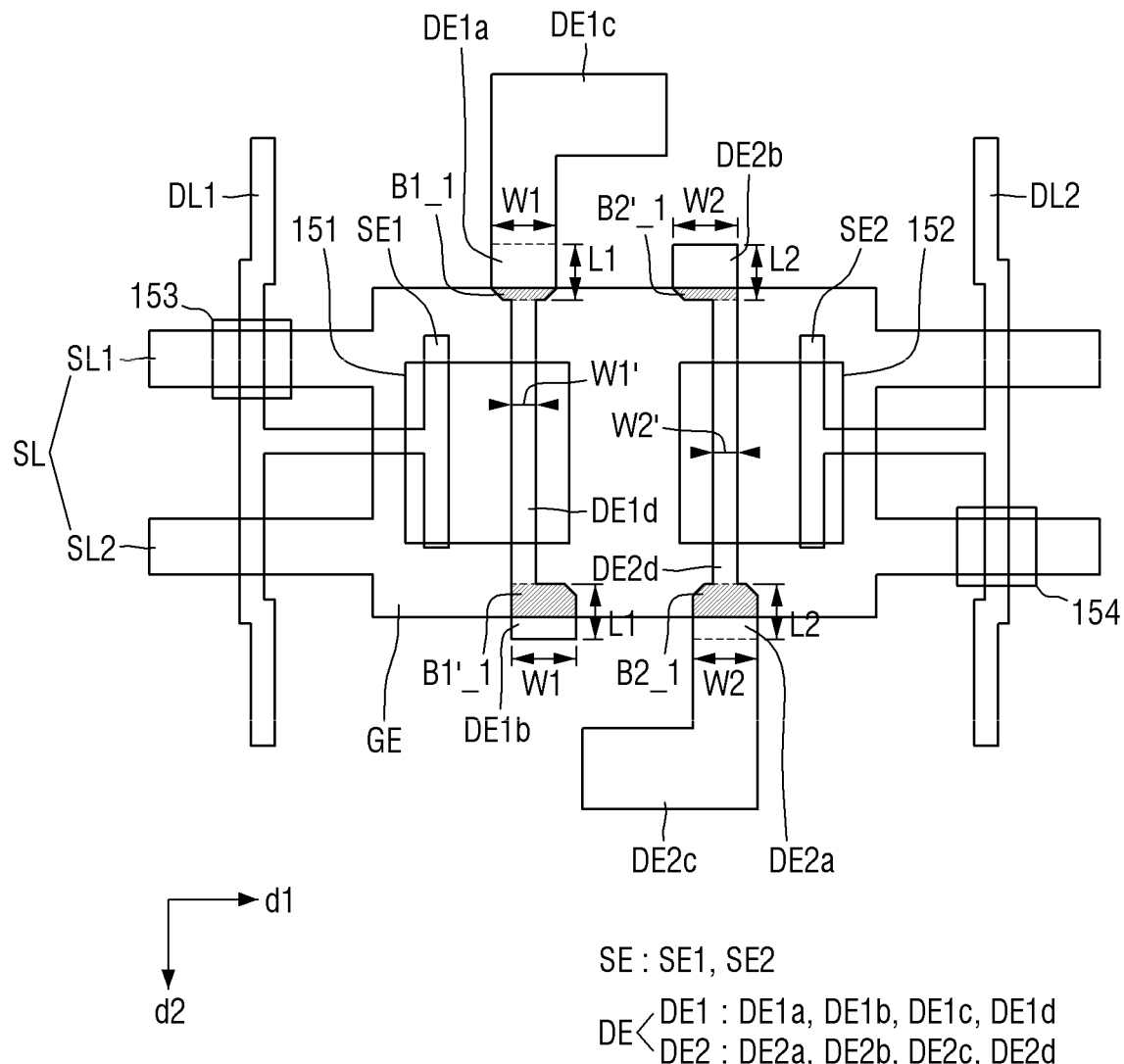
FIG. 13 is a layout view for illustrating a modified example of FIG. 12.

FIG. 13 is a layout view for illustrating a modified example of FIG. 12. Specifically, as compared to FIG. 12, FIG. 13 illustrates a state in which a data conductive layer 170 is shifted to one side (or an upper side of a plan view) of a second direction d2. Assuming that the data conductive layer 170 included in a display device 1 is shifted by as much as a linewidth w1' (e.g., about 2 μm) to one side of the second direction d2, FIG. 13 will be described below.

When the data conductive layer 170 is shifted to one side of the second direction d2, first and second source electrodes SE1 and SE2 and first and second drain electrodes DE1 and DE2 may be shifted to one side of the second direction d2. In this case, a channel width and a channel length of a first switching element TR1 may not be changed. This is because the first switching element TR1 may have an "I"-shaped channel and the first source electrode SE1 and the first drain electrode DE1 are formed to extend outside a first semiconductor pattern 151.

As shown in FIG. 13, even if the first and second drain electrodes DE1 and DE2 are shifted to one side of the second direction d2, the first and second drain electrodes DE1 and DE2 may protrude by as much as a predetermined length from a gate electrode GE to one side and the other side of the second direction d2.

That is, areas of regions B1_1 and B2_1 where connecting portions DE1$a$ and DE2$a$ of the first and second drain electrodes DE1 and DE2 overlap the gate electrode GE in a shifted state may be smaller than areas of regions B1 and B2 wherein the connecting portions DE1$a$ and DE2$a$ of the first and second drain electrodes DE1 and DE2 overlap the gate electrode GE in a normal state. Further, areas of regions B1'_1 and B2'_1 where compensation portions DE1$b$ and DE2$b$ of the first and second drain electrodes DE1 and DE2 overlap the gate electrode GE in the shifted state may be greater than areas of regions B1' and B2' where the compensation portions DE1$b$ and DE2$b$ of the first and second drain electrodes DE1 and DE2 overlap the gate electrode GE in in the normal state. However, the sum of the areas of the regions where the connecting portions DE1$a$ and DE2$a$ and the compensation portions DE1$b$ and DE2$b$ of the first and second drain electrodes DE1 and DE2 overlap the gate electrode GE in a normal state (B1+B1' and B2+B2') may be the same as in a shifted state (B1_1+B1'_1 and B2_1+ B2'_1).

Accordingly, the gate capacitance Cgs of the first switching element TR1 may not be changed. The first drain electrode DE1 may be disposed to protrude by a predetermined length or more to the outside of the gate electrode GE, and even if the data conductive layer 170 is shifted to one side of the second direction d2, an overlap area lost on the other side of the second direction d2 and an overlap area newly created on the other side of the second direction d2 may be equal and counterbalance each other.

When the data conductive layer 170 is shifted to the other side of the second direction d2, the first drain electrode DE1 may be shifted to the other side of the second direction d2. In this case, only a shifted direction is opposite as compared to a case in which the data conductive layer 170 is shifted to the one side of the second direction d2, substantially the same description as described above may be applied thereto.

A case in which the data conductive layer 170 is shifted to the one side or the other side of the first direction d1 will be examined. In a plan view, the first and second semiconductor patterns 151 and 152 may completely cover first and second source electrodes SE1 and SE2 and the first and second drain electrodes DE1 and DE2 of the first and second switching elements TR1 and TR2 in the first direction d1 with sufficient margins (e.g., in the first direction d1). Accordingly, even if a misalignment between the first and second semiconductor patterns 151 and 152 and the data conductive layer 170 occurs to the one side or the other side of the first direction d1, a channel width and a channel length of each of the first and second switching elements TR1 and TR2 may not be changed.

In a plan view, the gate electrode GE may completely cover the first and second drain electrodes DE1 and DE2 of the first and second switching elements TR1 and TR2 in a widthwise direction with sufficient margins (e.g., in the first direction d1). Accordingly, even if misalignment between the gate electrode GE and the data conductive layer 170 is occurred in a lateral direction, gate capacitances Cgs of the first and second switching elements TR1 and TR2 may not be changed.

The gate capacitance Cgs of the first switching element TR1 may not be changed but may be maintained to be constant. Thus, the kickback voltage Vkb of the first switching element TR1 may be maintained to be constant, and a residual image and visibility degradation of a display image due to the variation of the kickback voltages Vkb of the pixels PX may be prevented.

Referring to FIGS. 12 and 13, even if a shape of the compensation portion DE2$b$ of the first drain electrode DE1 is changed, when the data conductive layer 170 is shifted to the one side or the other side of the first direction d1 or to the one side or the other side of the second direction d2, a total area of an overlap region between the first drain electrode DE1 and the gate electrode GE may not be changed.

Figure 14:
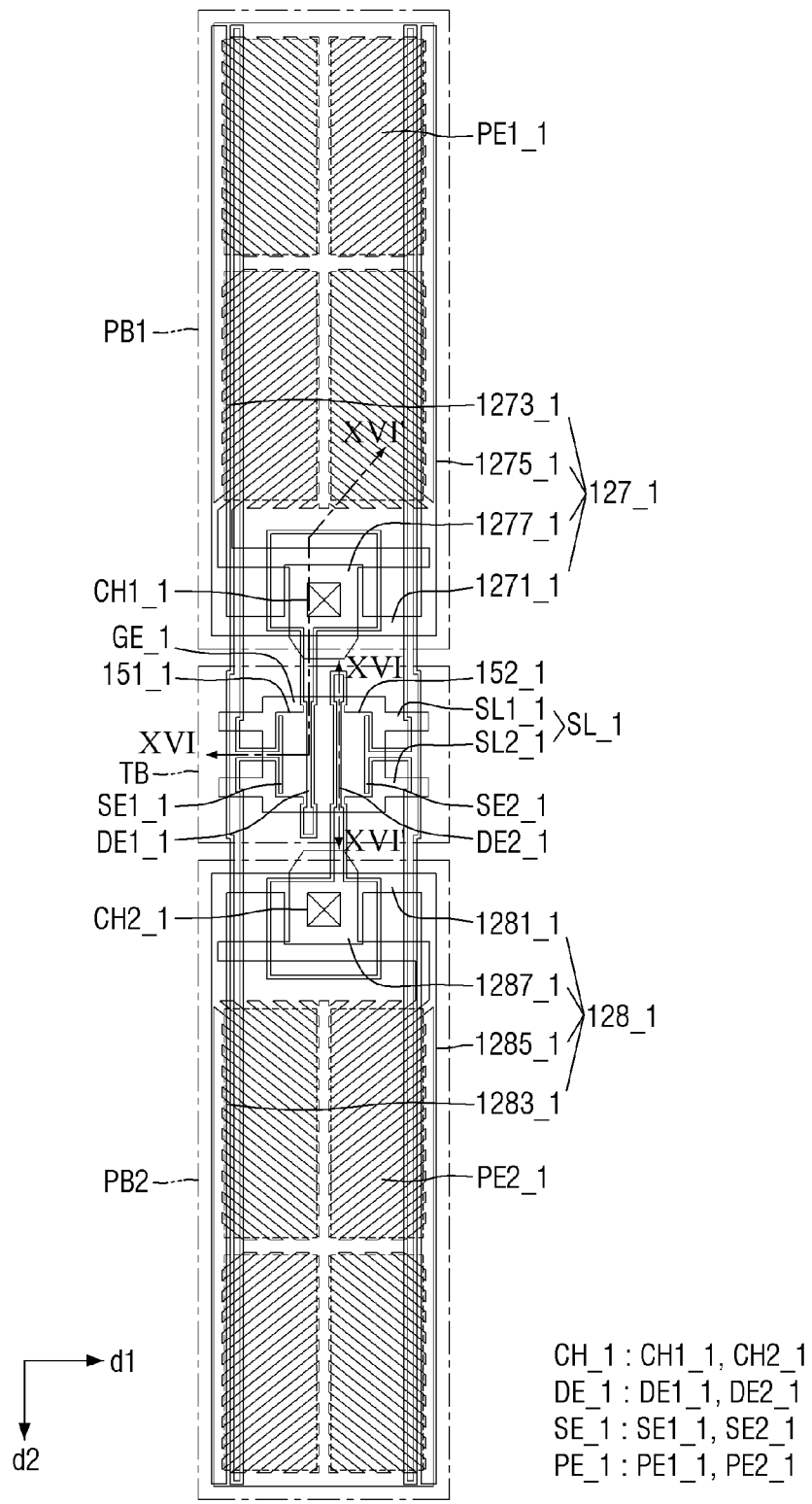
FIG. 14 is a layout view for illustrating a display device according to still another exemplary embodiment of the present disclosure.
Figure 15:
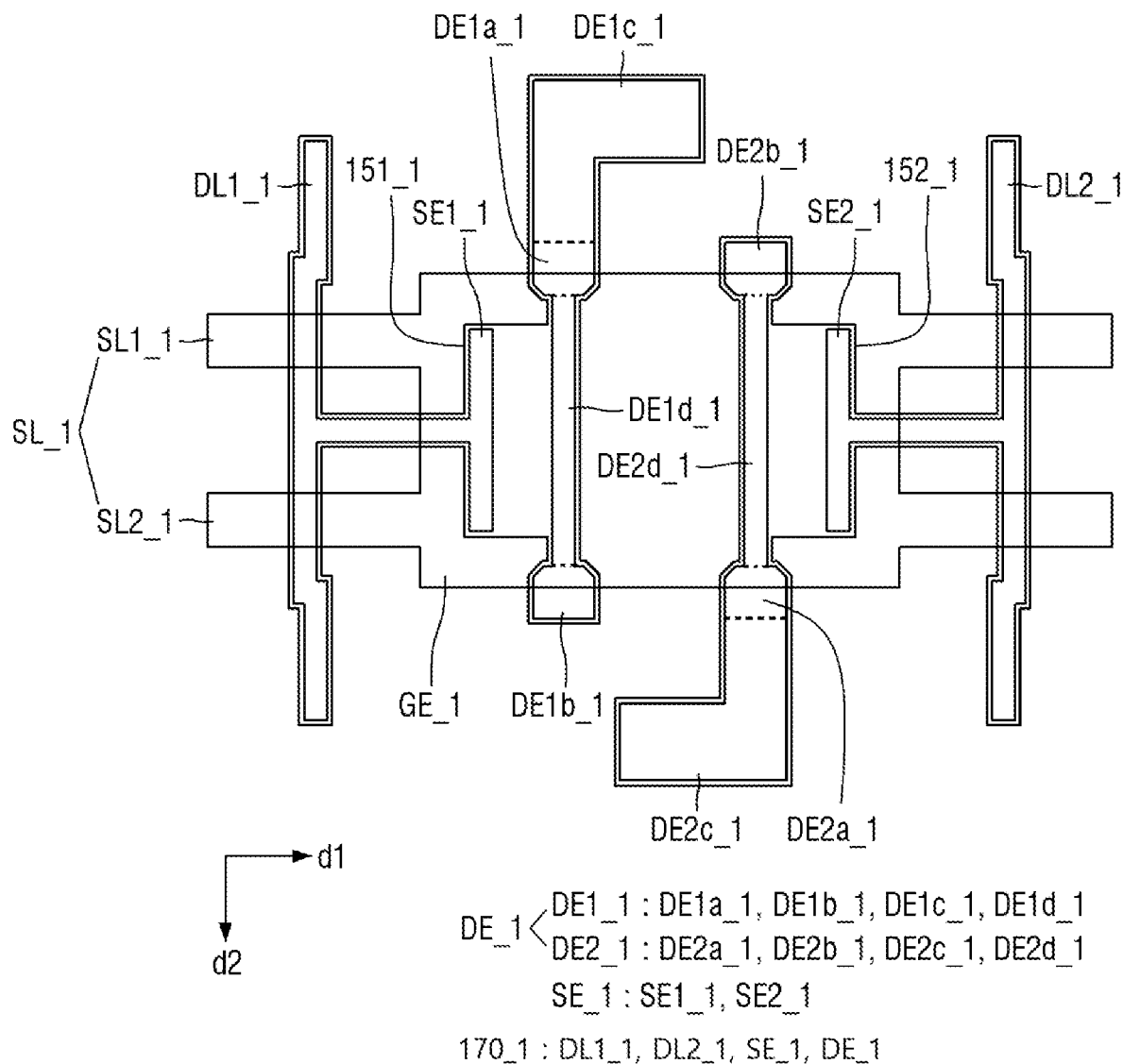
FIG. 15 is an enlarged view for illustrating a switching element region of FIG. 14.
Figure 16:
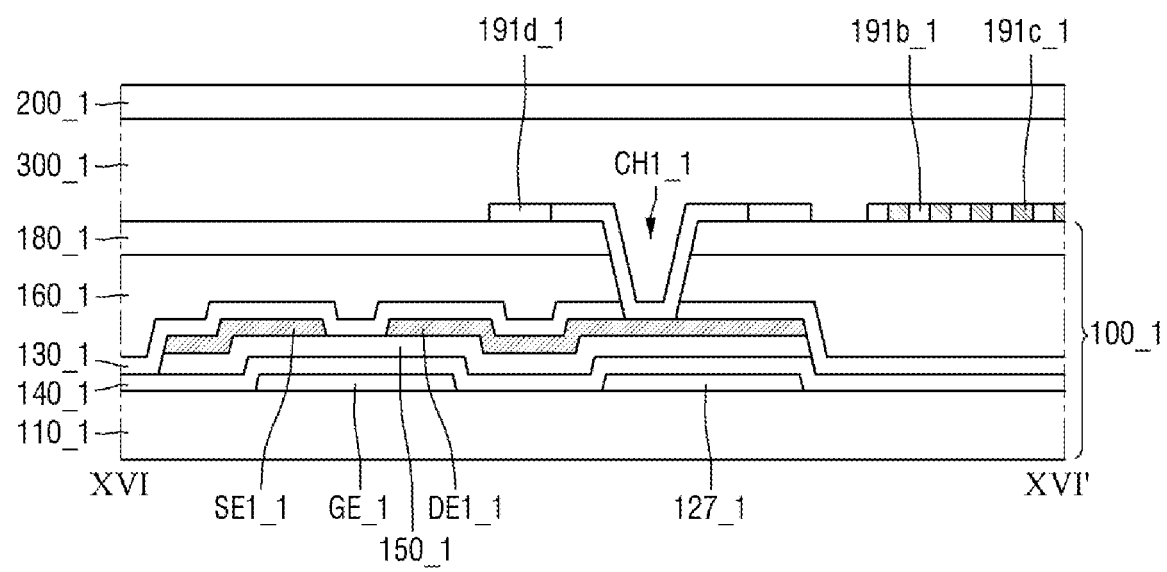
FIG. 16 is a cross-sectional view taken along line XVI-XVI' of FIG. 14.
Figure 17:
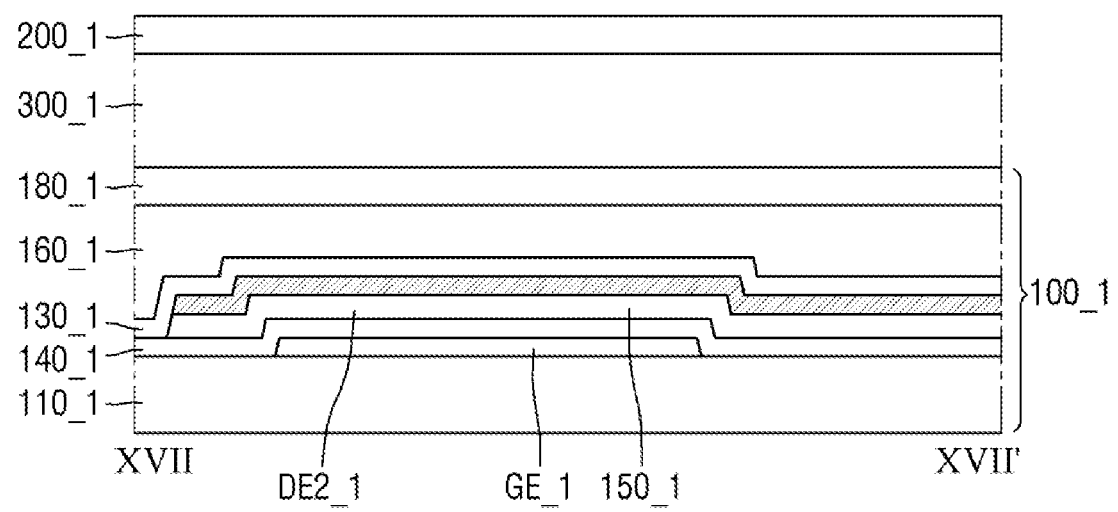
FIG. 17 is a cross-sectional view taken along line XVII-XVII' of FIG. 14.

FIG. 14 is a layout view for illustrating a display device according to another exemplary embodiment of the present disclosure. FIG. 15 is an enlarged view for illustrating a switching element region of FIG. 14. FIG. 16 is a cross-sectional view taken along line XVI-XVI' of FIG. 14. FIG. 17 is a cross-sectional view taken along line XVII-XVII' of FIG. 14.

FIGS. 14 to 17 illustrate a case in which a semiconductor layer 150_1 and a data conductive layer 170_1 are formed using one mask when forming the display device. Thus, the semiconductor layer 150_1 may have substantially the same pattern shape as the data conductive layer 170_1 except for a channel region. In the channel region, although the data conductive layer 170_1 is separated into a source electrode SE_1 and a drain electrode DE_1, the semiconductor layer 150_1 may have one connected pattern. A semiconductor layer 150_1 of a first switching element of a first pixel PX1 and a semiconductor layer 150_1 of a second switching element of a second pixel PX2 may not be separated from each other but integrally connected. The semiconductor layer 150_1 may be disposed under the data conductive layer 170_1 in the remaining region. The data conductive layer 170_1 may be disposed on the semiconductor layer 150_1 and may not be in direct contact with a gate insulating layer 140_1. An area occupied by the data conductive layer 170_1 may be smaller than an area occupied by the semiconductor layer 150_1. The semiconductor layer 150_1 may not have an island shape but have a linear shape along a pattern shape of the data conductive layer 170_1.

In the present embodiment, because the semiconductor layer 150_1 and the data conductive layer 170_1 are patterned using one mask, a misalignment between the drain electrode DE_1 and the semiconductor layer 150_1 may not be occurred. Meanwhile, the drain electrode DE_1 may still be misaligned with the gate electrode GE_1 in the second direction d2. Because the drain electrode DE_1 has connecting portions DE1$a$_1 and DE2$a$_1 and compensation portions DE1$b$_1 and DE2$b$_1 which extend to both sides on the gate electrode GE_1, even if the drain electrode DE_1 is shifted in the second direction d2, an overlap area between the gate electrode GE_1 and the drain electrode DE_1 may be maintained to be the same as described with reference to FIGS. 10 and 11.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:
   a substrate;
   a gate electrode disposed on the substrate;
   a semiconductor pattern disposed to overlap the gate electrode;
   a source electrode disposed on the semiconductor pattern;
   a drain electrode disposed on the semiconductor pattern and facing the source electrode; and
   a pixel electrode connected to the drain electrode,
   wherein the drain electrode comprises a bar-shaped region disposed on the semiconductor pattern and extending in one direction, a compensation region connected to one distal end of the bar-shaped region, a connecting region connected to the other distal end of the bar-shaped region, and a pad connected to the connecting region and overlapping the pixel electrode, and
   wherein the bar-shaped region has a first maximum width and the compensation region and the connecting region have a same second maximum width that is greater than the first maximum width.

2. The display device of claim 1, wherein one end of the connecting region connected to the other distal end of the bar-shaped region is disposed to overlap the gate electrode, the other end of the connecting region is disposed not to overlap the gate electrode, one end of the compensation region connected to the one distal end of the bar-shaped region is disposed to overlap the gate electrode, and the other end of the compensation region is disposed not to overlap the gate electrode.

3. The display device of claim 2, wherein the one end of the connecting region and the one end of the compensation region have the first maximum width, and the other end of the connecting region and the other end of the compensation region have the second maximum width.

4. The display device of claim 1, wherein the compensation region and the connecting region have a symmetrical shape to each other about a line perpendicular to the direction in which the bar-shaped region extends.

5. The display device of claim 1, wherein a length of the bar-shaped region is greater than or equal to a length of the source electrode that faces the bar-shaped region.

6. A display device comprising:
   a plurality of scan lines extending in a first direction,
   a plurality of data lines extending in a second direction which crosses the plurality of scan lines, and
   a plurality of pixels arranged in a matrix configuration and connected to the plurality of scan lines and the plurality of data lines,
   wherein each of the plurality of pixels includes:
   a thin film transistor including a semiconductor pattern, a gate electrode, a source electrode, a drain electrode which faces the source electrode and is spaced apart a predetermined distance from the source electrode, and a pixel electrode connected to the drain electrode,
   wherein the drain electrode includes:
   a bar-shaped region disposed on the semiconductor pattern and extending in the second direction, a compensation region connected to one distal end of the bar-shaped region, a connecting region connected to the other distal end of the bar-shaped region, and a pad connected to the connecting region, and
   wherein the bar-shaped region has a first maximum width and the compensation region and the connecting region have a same second maximum width that is greater than the first maximum width.

7. The display device of claim 6, wherein the compensation region and the connecting region are symmetrical about a line of symmetry which extends in the first direction.

8. The display device of claim 7, wherein one end of the connecting region connected to the other distal end of the bar-shaped region and an one end of the compensation region connected to the one distal end of the bar-shaped region are disposed to overlap the gate electrode.

9. The display device of claim 8, wherein the other end of the connecting region and the other end of the compensation region are disposed not to overlap the gate electrode.

10. The display device of claim 9, wherein the one end of the connecting region and the one end of the compensation region have the first maximum width, and the other end of the connecting region and the other end of the compensation region have the second maximum width.

11. The display device of claim 10, wherein a maximum width of the connecting region and a maximum width of the compensation region have the first maximum width where the connecting region and the compensation region are connected to the bar-shaped region and have the second maximum width at the other end of the connecting region and the other end of the compensation region.

12. The display device of claim 7, wherein the source electrode comprises a lateral extension connected to a respective data line of the plurality of data lines and extending from the respective data line in the first direction, and a vertical extension extending parallel to the drain electrode from an end of the lateral extension in the second direction.

13. The display device of claim 12, wherein a length of the bar-shaped region is greater than or equal to a length of the vertical extension of the source electrode.

14. The display device of claim 13, wherein the bar-shaped region of the drain electrode and the vertical extension of the source electrode completely overlap the semiconductor pattern in the second direction.

15. The display device of claim 14, wherein the pad extends from the connecting region in the first direction.

16. The display device of claim 15, wherein the gate electrode completely overlaps the semiconductor pattern.

17. The display device of claim 16, wherein the gate electrode completely covers the vertical extension in the second direction.

18. The display device of claim 7, wherein each of the plurality of scan lines includes a first sub-scan line and a second sub-scan line spaced apart a predetermined distance, extending in the first direction and connected to the gate electrode at a location adjacent to opposing edges of the gate electrode.

19. The display device of claim 18, further comprising a dummy semiconductor pattern disposed between the plurality of scan lines and the plurality of data lines at a location in which the plurality of scan lines and the plurality of data lines overlap each other.

* * * * *